United States Patent [19]
Nishioka et al.

[11] Patent Number: 5,136,271
[45] Date of Patent: Aug. 4, 1992

[54] MICROWAVE INTEGRATED CIRCUIT MOUNTINGS

[75] Inventors: Yasuhiko Nishioka; Hazime Kawano; Kazuyoshi Inami, all of Kanagawa, Japan

[73] Assignee: Mitsubishi Denki Kabushiki Kaisha, Japan

[21] Appl. No.: 674,619

[22] Filed: Mar. 25, 1991

Related U.S. Application Data

[62] Division of Ser. No. 461,641, Jan. 5, 1990, Pat. No. 5,023,634.

[51] Int. Cl.$^5$ .......................... H01P 3/08; H05K 7/06
[52] U.S. Cl. ..................... 333/246; 333/247
[58] Field of Search .................. 333/238, 246, 247; 361/414

[56] References Cited

U.S. PATENT DOCUMENTS

| | | |
|---|---|---|
| 3,757,272 | 9/1973 | Laramee et al. |
| 4,047,132 | 9/1977 | Krajewski ............. 333/238 |
| 4,494,083 | 1/1985 | Josefsson et al. ........ 333/246 X |
| 4,620,264 | 10/1986 | Ushifusa et al. |
| 4,639,760 | 1/1987 | Granberg et al. |
| 4,739,448 | 4/1988 | Rowe et al. ............ 361/414 X |
| 4,751,482 | 6/1988 | Fukuta et al. .......... 333/247 |
| 4,768,004 | 8/1988 | Wilson |
| 4,812,792 | 3/1989 | Leibowitz ............. 333/238 |
| 4,821,142 | 4/1989 | Ushifusa et al. |

FOREIGN PATENT DOCUMENTS

| | | |
|---|---|---|
| 0001890 | 10/1978 | European Pat. Off. |
| 0157505 | 3/1985 | European Pat. Off. |
| 0211619 | 7/1986 | European Pat. Off. |
| 198698 | 10/1986 | European Pat. Off. ......... 333/247 |
| 0272046 | 12/1987 | European Pat. Off. |
| 2620275 | 9/1987 | France |

OTHER PUBLICATIONS

Cook et al., "New Packaging Goes & Modular", *Microwaves & RF*, Jun. 1986, pp. 69-71.
Nordwall, B. D., "Ultra-Reliable Radar Technology To Benefit ATF Program", *Aviation Week & Space Tech.*, Jun. 27, 1988, p. 67.
Goodman, Jr., G. W., "Next-Generation Ground-Based Radars Will Be More Mobile and Highly Reliable", *Armed Forces Journal Int'l*, Jan. 1991, p. 51.

*Primary Examiner*—Paul Gensler
*Attorney, Agent, or Firm*—Wolf, Greenfield & Sacks

[57] ABSTRACT

An integrated circuit package having enhanced mounting density is provided. The package includes a microwave integrated circuit and a drive circuit therefor, both accommodated in a casing having a layer structure made of a multi-layer ceramic. Through holes in a multi-layer ceramic are utilized for wiring so that the number of conductive tracks provided on the same plane can be reduced and the mounting density can be enhanced. The integrated circuit and the drive circuit are disposed in the casing vertically with respect to each other to reduce the overall longitudinal dimension of the package and enhance mounting density. High frequency connectors adapted to feed high frequency signals to the integrated circuit, and connector pins adapted to supply external control signals and a power signal to the drive circuit, are connected on the underside surface of the casing. A through hole of a horse shoe type is formed through one of the dielectric members, and metallic material is filled therein to provide an external conductor for coaxial tracks. Alternatively, this through hole can be processed by plating or the like to improve the electrical characteristics.

21 Claims, 20 Drawing Sheets

MICROWAVE INTEGRATED CIRCUIT MOUNTINGS

This application is a divisional application of application Ser. No. 07/461,641 filed on Jan. 5, 1990, now U.S. Pat. No. 5,023,634.

TECHNICAL FIELD

The present invention relates to a radar system and more particularly to an antenna system adapted to be used for a radar system which employs a phased array method for the transmission system and a digital beam forming method for the reception system.

The present invention relates further to a mounting method for integrated circuits containing microwave circuits suitable for the transmission/reception systems of an antenna system.

PRIOR ART

An example of the constitution of an antenna system of this type according to the prior art is illustrated in FIG. 1. In FIG. 1, numeral 1 designates an element antenna, numeral 2 a miniature transmitter/receiver, numeral 4 an entire reception signal converting unit, numeral 5 a distributor, numeral 6 a transmission signal/reception signal switching unit, numeral 7 a frequency converter, numeral 8 a band-pass filter, numeral 9 an analog/digital converter, numeral 10 an electro/optical converter, numeral 11 a signal processing unit and numeral 12 an input terminal.

FIG. 2 illustrates an example of the interior constitution of the miniature transmitter/receiver 2 shown in FIG. 1. In FIG. 2, numeral 13 designates a phase shifter, numeral 14 a transmission/reception switch, numeral 15 a high power amplifier, numeral 16 a low-noise amplifier and numerals 17 and 18 input and output terminals.

FIG. 3 illustrates an example of the interior constitution of the transmission signal/reception signal switching unit 6 shown in FIG. 1. In FIG. 3, numerals 19a and 19b designate respective switches, numeral 20 an input/output terminal and numerals 22, 23 output terminals.

Operation of an antenna system according to the prior art will now be explained with reference to FIGS. 1-3.

The signals input to the input terminal 12 as the time sharing signals comprised of the transmission signals and the local oscillation signals from an external apparatus will be input to the transmission signal/reception signal switching unit 6 in each of a plurality of reception signal converting units 4 via the distributor 5. The transmission signal/reception signal switching unit 6 is constituted as shown in FIG. 3, wherein, in a transmission mode, the two switches 19a, 19b are switched in synchronization with the transmission signals to apply only the transmission signals of the input signals to the input/output terminal 21. In the mean time, in a reception mode, the switches 19a, 19b are switched in synchronization with the local oscillation signals, so that the local oscillation signals alone are output to the output terminal 23 while the reception signals from the input/output terminal 21 alone are applied to the output terminal 22 by the switch 19b.

The transmission signals which have been separated by the transmission signal/reception signal switching unit 6 are input to the miniature transmitter/receiver 2, such as the transmitter/receiver 2-1a. The miniature transmitter/receiver 2-1a is constituted as shown in FIG. 2, so that the transmission signals input to the input/output terminal 17 are input to the phase shifter 13 through the transmission/reception switching unit 14a and after controlled in a digital manner so as to attain a predetermined transmission phase, they are amplified by the high power amplifier 15 and then output to the output terminal 18 by way of the transmission/reception switch 14b. The transmission signals are then emitted in the air by way of the element antenna 1-1a connected to the input/output terminal 18. Since the antenna system consists of a plurality of the reception signal converters (4-1a–4-Nm), the miniature transmitters/receivers (2-1a–2-Nm) and the element antennas (1-1a–1-Nm), the phases of the transmission signals (or the transmission electric waves) can be aligned by controlling the phase shifter 13 in corporate in each of the miniature transmitters/receivers (2-1a–2-Nm) and the power of the transmission signals can be concentrated in a desired direction. (As explained above, the radar method which synthesizes the transmission electric waves from the respective element antennas in the air and provides the transmission electric waves with directivity is referred as the phased array radar.)

On the other hand, the reception signals input from the element antenna 1-1a are amplified by the low noise amplifier 16 by way of the transmission/reception switch 14b incorporated in the miniature transmitter/receiver 2 and output to the input/output terminal 17 by way of the transmission/reception switching unit 14a and then input to the reception signal converting unit 4-1a. Operation of the transmission signal/reception signal switching unit 6 incorporated in the reception signal converting unit 4-1a causes the reception signals to be input from the input terminal 12 and synchronized with the local oscillation signals which have been distributed by the distributor, and to be input to the frequency converter 7 respectively. In this frequency converter 7, the reception signals and the local oscillation signals are mixed up and converted to the intermediate frequency reception signals. The reception signals are then sent to the band-pass filter 8 adapted to remove unnecessary frequency signals which have been generated due to the mixing, and are converted into digital signals by the A/D converter 9 and further are converted into optical digital reception signals by the electro/optical converter 10 to be input to the signal processing unit 11. The antenna system is provided with a plurality of the circuit systems having the functions as explained above in a similar manner to the transmission system. The optical digital signals output from the respective reception signal converters (4-1a–4-Nm) are then input to the signal processing unit 11, which in turn synthesizes the input signals from the respective element antennas (1-1a–1-Nm) instantaneously by a high speed operation to provide the signals with a desired directivity. (The radar system in which the reception signals from the respective element antennas are processed at a high speed so that the reception power can be synthesized instantaneously is referred as a digital beam forming radar.)

This digital beam forming radar enables the input signals from the respective antenna elements to be weighted. Accordingly if the element antennas are arranged on a given profiled surfaces such as the surface of an aircraft body or the like, the side lobe level generated in the reception antenna pattern characteristics provided by synthesizing the reception signals may be so easily controlled that an ideal antenna pattern may be formed.

It is to be noted in the circuit constitution as described above that the electro/optical converter 10 is essential for transmitting the reception signals to the signal processing unit 11 without distorting them if they are converted to digital signals at a high speed by the A/D converter 9 and a compact construction may thereby be attained.

The antenna system according to a prior art is constituted as explained above. However, it has caused such problems as requiring a large scale circuit, the power consumption of the A/D converter 9 and the electro/optical converter 10 necessary for high speed signal processing is considerable, and so forth, resulting in difficulty in applying it for installation on an aircraft having strict limitation in terms of weight, dimension and power consumption.

FIG. 4(a) is the front view illustrating an example of the integrated circuit incorporating the micro wave circuit to be used for the antenna system, provided according to the mounting method of a prior art. FIG. 4(b) and FIG. 4(c) are respectively the side elevation of FIG. 4(a). It is to be understood that for convenience of illustration of the mounting condition the enclosure cover has been removed. In FIG. 4(a), numeral 41 designates a micro wave integrated circuit, numerals 42a, 42b input/output pads for the high frequency signals provided on the micro wave integrated circuit 41, numerals 43a, 43b input/output pads for drive signals provided on the micro wave integrated circuit 41, numeral 44 a drive circuit adapted to drive the micro wave integrated circuit 41, numerals 45a, 45b, 45c, 45d input/output pads for drive signals provided on the drive circuit 44, numerals 48a, 48b a high frequency connectors for inputting high frequency signals from outside and outputting the same to outside, numerals 49a, 49b connector pins adapted to input the external control signals to the drive circuit 44, numerals 47a, 47b, 47c, 47d, 47e, 47f, gold wires variously connecting the connector pins 49a, 49b and the input/output pads 45a, 45b, 45c, 45d for drive signals, pads 45b, 45d and the input/output pads 43a, 43b for drive signals and the input/output pads 42a, 42b for high frequency signals and the high frequency connectors 48a, 48b, and the numeral 40 designates an accommodation casing. For simplicity of description, components attached on the micro wave integrated circuit 41 and the drive circuit 44 are omitted.

Operation of the integrated circuit will next be explained. The high frequency signals input from the high frequency connector 48a are input to the microwave integrated circuit 41 via the metallic wire 47c and the input/output pad 42a for high frequency signals. On the other hand, the drive circuit 44 provides predetermined drive signals corresponding to the external control signals input from the connector pins 49a, 49b so that the high frequency signals being transmitted in the micro wave integrated circuit 41 are set at a predetermined level and are output to the external device by way of the input/output pad 42b for the high frequency signals, the gold wire 47f and the connector 48b for high frequency signals.

Since the micro wave integrated circuit 41 and the associated drive circuit 44 have been mounted on a plane relative to each other like in the manner of the integrated circuit of a prior art as shown in FIG. 4, the longitudinal dimension of these circuits in the mounted condition had to be long, and since the components to be installed on the micro wave integrated circuit 41 are those for high frequency signal, the height of those components had to be far lower than that of the components installed on the drive circuit 44, this caused loss in the mounting space, leaving the problems to be solved in view of a high density mounting.

FIG. 5(a) is the front view of mounting illustrating the second example of the integrated circuit provided according to a prior art mounting method. FIG. 5(b) is the side elevation of FIG. 5(a). FIG. 6 is the sectional view taken along the line A—A' in FIG. 5(a). It is to be understood that for clear illustration of the mounting condition, the seal cover is removed. In FIG. 5(a), numeral 51 designates a first micro wave integrated circuit, numerals 52a, 52b input/output pads provided on the first micro wave integrated circuit 51, numeral 53 is a second micro wave integrated circuit, numerals 54a, 54b input/output pads provided on the second micro wave integrated circuit 53, numeral 55 a metallic conductor adapted to install the first micro wave integrated circuit 51 and the second micro wave integrated circuit 53, numeral 59 a metallic frame for sealing, numerals 70a, 70b a dielectric member, numerals 60a, 60b strip tracks formed on the dielectric members, 70a, 70b respectively 71a, 71b dielectric members electrically insulating the metallic frame 59 for sealing and the strip tracks 60a, 60b and numerals 61a, 61b gold wires connecting the input/output pads 52a, 52b for the first micro wave integrated circuit, the input/output pads 54a, 54b for the second microwave integrated circuit and the strip tracks 60a, 60b. It is to be noted that for the sake of simplifying the explanation the components to be installed on the first micro wave integrated circuit 51 and the second micro wave integrated circuit 53 are omitted.

Operation of the above-described circuit will next be explained. In FIG. 5(a), the high frequency signals input from the strip track 60a are input to the first micro wave integrated circuit 51 by way of the gold wire 61a, the input/output pad 52a of the first micro wave integrated circuit and are set at a predetermined level, and then are output to the input/output pad 52b of the first micro wave integrated circuit. The signals are further input to the second micro wave integrated circuit 53 by way of the gold wire 61b, the input/output pad 54a of the second micro wave integrated circuit and are set at another predetermined level, and then are output the outside by way of the input/output pad 54b of the second micro wave integrated circuit, the gold wire 61c and the strip track 60b.

Since the first micro wave integrated circuit 51 and the second micro wave integrated circuit 53 which operate as described above, have been mounted on plane relative to each other according to the prior art mounting, as shown in FIG. 5(a), the longitudinal dimension of these circuits had to be long to expand the mounting area, resulting in difficulty in realizing many functions in a limited mounting area. Furthermore as shown in FIG. 5(b) and FIG. 6, since the dielectric members 70a, 70b and the dielectric members 71a, 71b are embedded in the metallic frame 59 for sealing, severe machining precision as well as assembly accuracy are required thus resulting in high cost.

SUMMARY OF THE INVENTION

The present invention has been proposed to solve the problems as explained above.

Accordingly an object of the present invention is to improve the mounting density of an integrated circuit including a micro wave circuit, for use in an antenna system as described above.

The present invention further has another object to provide an integrated circuit which has enhanced the mounting density by accommodating a micro wave integrated circuit and the drive circuit associated with such a micro wave integrated circuit in an accommodation casing having a multi-layer ceramic layer structure and reducing the tracks on the same plane by utilizing the through-holes in the multi-layer ceramic for wiring.

Still another object of the present invention is to provide an integrated circuit which has enhanced the mounting density by accommodating a micro wave integrated circuit and the drive circuit associated with such a micro wave integrated circuit in an accommodation casing having a layer structure and disposing them vertically so as to reduce the longitudinal dimension required and also reducing the ineffective space over the micro wave integrated circuit.

A further object of the present invention is to provide an integrated circuit which has enhanced the mounting density by providing high frequency connectors adapted to feed high frequency signals to a micro wave integrated circuit and connector pins adapted to supply external control signals and a power signal to a drive circuit for the micro wave integrated circuit at the underside surface of the accommodation casing so as to reduce the longitudinal dimension of the integrated circuit.

According to the present invention, since the micro wave integrated circuit and the drive circuit for the micro wave integrated circuit are accommodated in the accommodation casing having a layer structure made of a multi-layer ceramic and the through holes in the multi-layer ceramic are utilized for wiring, the number of the tracks provided on the same plane can be reduced and the mounting density can be enhanced.

Further according to the present invention, the micro wave integrated circuit and the drive circuit for the micro wave integrated circuit are accommodated in the accommodation casing having a layer structure and they are disposed vertically, so that the longitudinal dimension of the integrated circuit can be reduced and the ineffective space over the micro wave integrated circuit can be reduced and the mounting density can be enhanced.

Also according to the present invention, the high frequency connectors adapted to feed the high frequency signals to the micro wave integrated circuit and the connector pins adapted to supply the external control signals and the power signal to the drive circuit for the micro wave integrated circuit are provided and connected on the underside surface of the accommodation casing so as to reduced the longitudinal dimension of the integrated circuit.

Another object of the present invention is to provide a package for a micro wave integrated circuit in which the micro wave integrated circuit is mounted in a hierarchical manner so as to reduce the mounting area and the productivity is enhanced by dispensing with strict machining precision, etc. required for the field through portions.

It is also an object of the present invention to provide a micro wave integrated circuit by mounting a plurality of micro wave integrated circuits in an accommodation package in a hierarchical manner, the package having a layer structure provided by a multi-layer dielectric member so as to contact the mounting area.

The present invention still has another object to attain the electrical connection of the micro wave integrated circuit having vertical mounting by forming micro strip tracks, triplate tracks, and coaxial tracks on a multi-layer dielectric member and constituting a means transforming high frequency transmission tracks in a horizontal-vertical-horizontal direction.

Still a further object of the present invention is to provide a micro wave integrated circuit wherein a through hole of a horse shoe type is formed through a dielectric member and metallic material is filled therein so as to provide an external conductor for the coaxial tracks, whereby coaxial tracks can be formed in the dielectric member.

Another object of the present invention is to provide a micro wave integrated circuit wherein the machining accuracy and assembly accuracy can be improved by overlapping the feed through portions and the dielectric member.

Still another object of the present invention is to provide a micro wave integrated circuit wherein through holes are provided at the circumference of the respective layers of a multi-layer dielectric member and these through holes are connected to compose an electromagnetic shield.

According to the mounting method of the micro wave integrated circuit of the present invention, since a plurality of micro wave integrated circuits can be mounted in a hierarchical manner in the accommodation package having a layer structure provided by a multi-layer dielectric member, a micro wave integrated circuit having multi functions in a limited mounting area can be provided.

BRIEF DESCRIPTION OF THE DRAWINGS

FIG. 4 illustrates the first example of the integrated circuit including a micro wave circuit in accordance with the mounting method of a prior art.

FIG. 5 illustrates the second example of the integrated circuit in accordance with the mounting method of a prior art.

FIG. 13(a) is the front view of the integrated circuit and FIG. 13(b) and FIG. 13(c) are respectively the side elevations thereof;

FIG. 15(a) is the front view of the integrated circuit and FIG. 15(b) and FIG. 15(c) are respectively the side elevations thereof;

FIG. 17 illustrates a third embodiment of the integrated circuit in accordance with the mounting method according to the present invention.

FIG. 20(a) is the front view of the integrated circuit and FIG. 20(b) is the side elevation thereof;

DETAILED DESCRIPTION OF THE PREFERRED EMBODIMENTS

Figure 1:
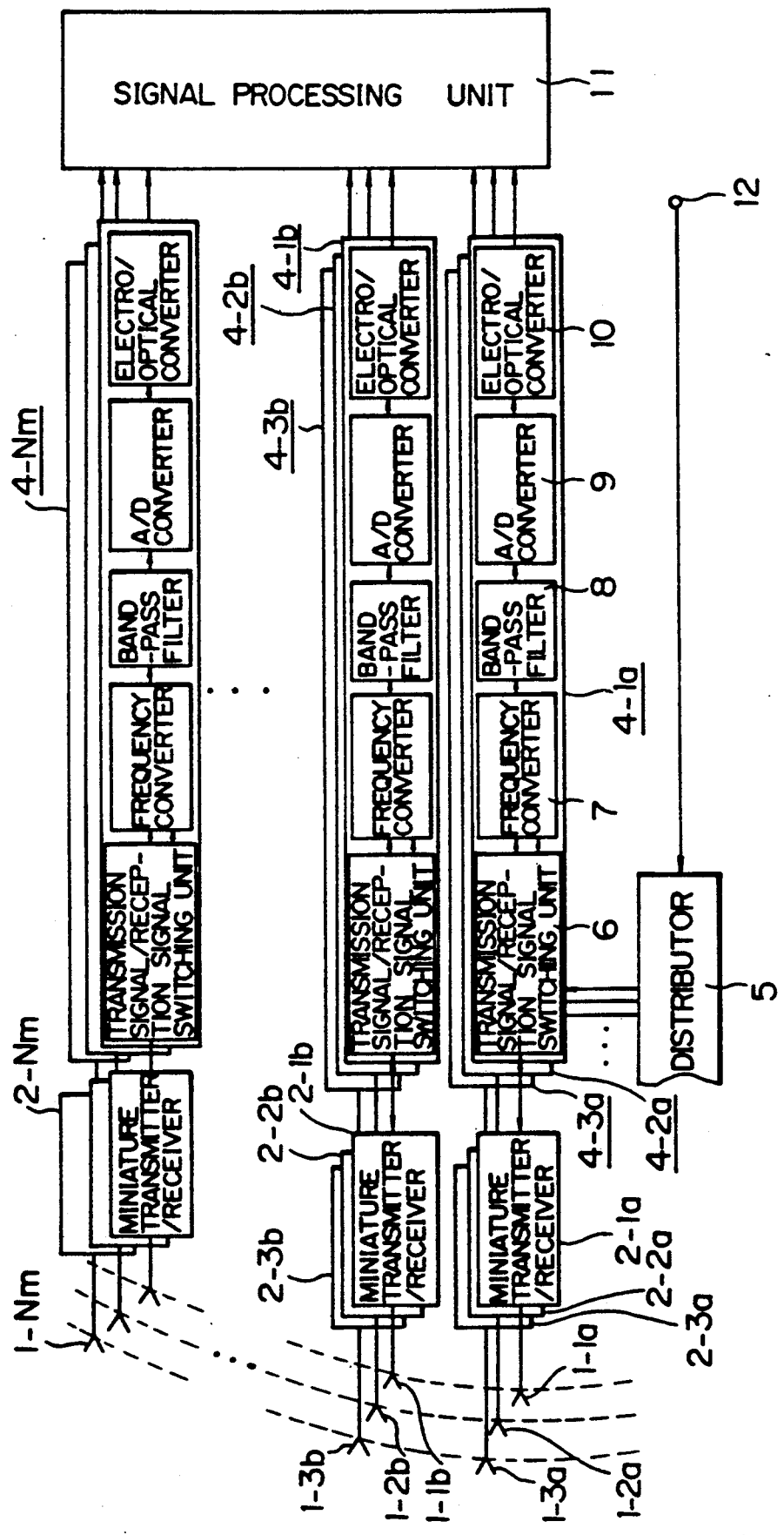
FIG. 1 is the block diagram illustrating the antenna system according to a prior art.
Figure 7:
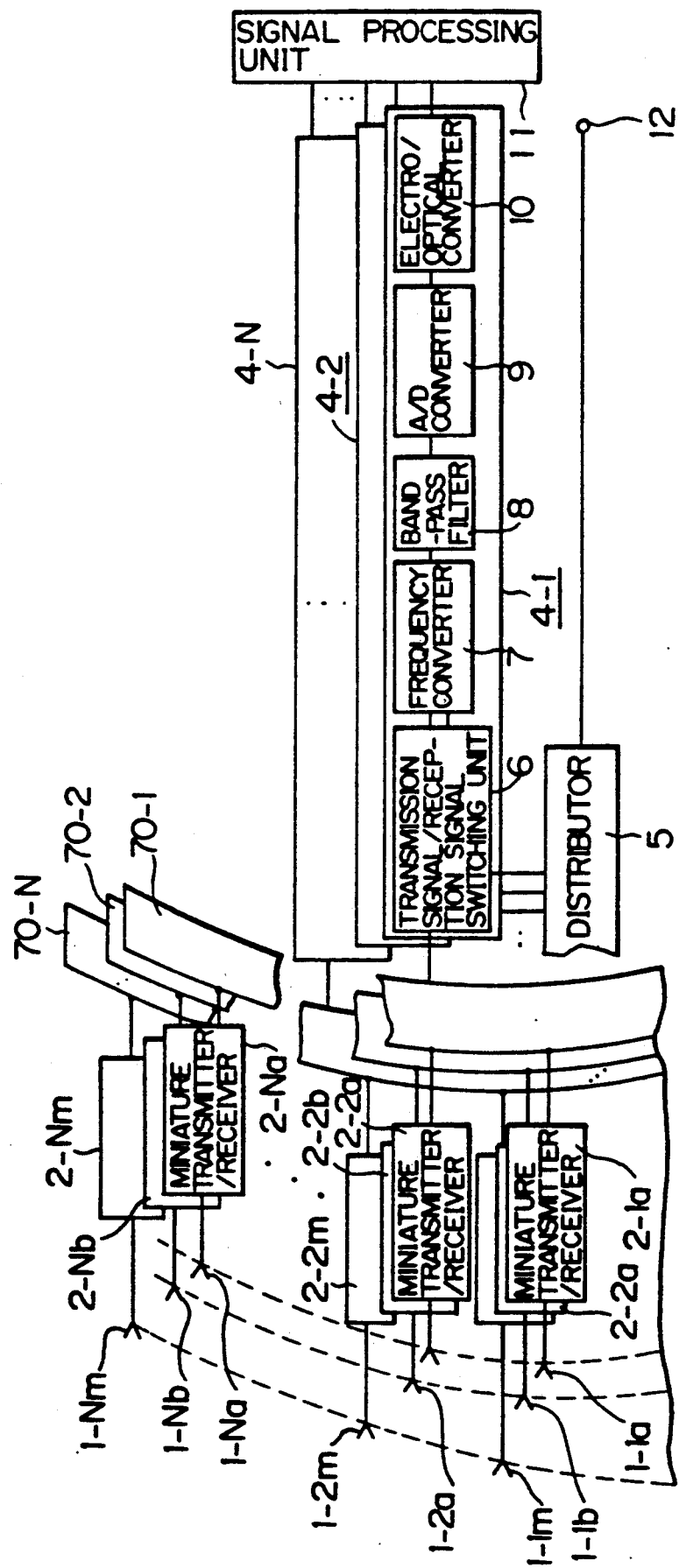
FIG. 7 is the block diagram illustrating a first embodiment of the antenna system according to the present invention.
Figure 8:
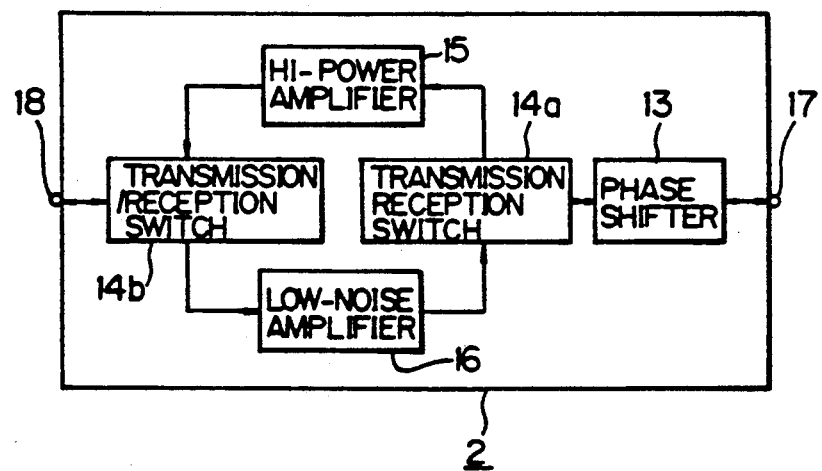
FIG. 8 is the block diagram illustrating the miniature transmitter/receiver to be used for the antenna system shown in FIG. 7.

The first embodiment of the present invention will now be explained by referring to FIGS. 7 and 8. In FIG. 7, numeral 70 designates a power supply circuit. The signals input to the input terminal 12 as the time sharing signals composed of the transmission signals and the local oscillation signals from the external apparatus are separated by the reception signal converting unit 4 into the reception signals and the local oscillation signals, similar to the prior art shown in FIG. 1. The transmission signals are output to the power supply circuit 70 and the local oscillation signals are output to the frequency converter 7 respectively.

Figure 2:
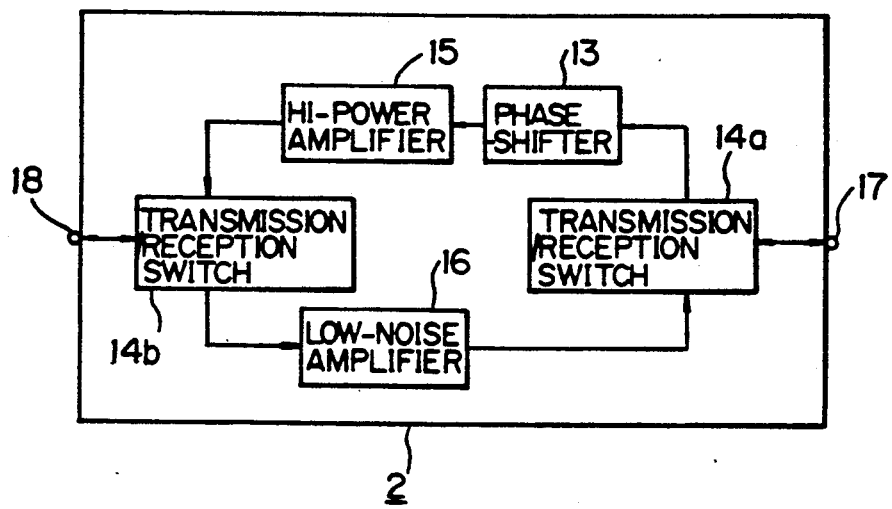
FIG. 2 is the block diagram illustrating the miniature transmitter/receiver to be used for the antenna system according to a prior art shown in FIG. 1.
Figure 3:
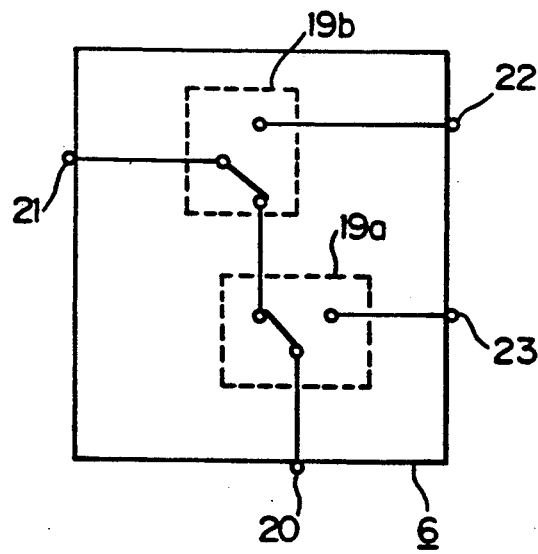
FIG. 3 illustrates the constitution of the transmission/reception signal switching unit to be provided in the reception signal converting unit shown in FIG. 1.

The transmission signals output from the reception signal converting unit 4, for example, 4-1 are applied to the power supply circuit 70-1. The power supply circuit 70-1 is made up of a plurality of blocks respectively adapted to supply the power signal in the vertical direction (or the lateral direction) depending on the arrangement of the element antenna and to divide the transmission signals. The divided transmission signals are input to a plurality of the miniature transmitters/receivers (2-1a-2-1m) connected to the power supply circuit 70-1. The miniature transmitter/receiver 2 is constituted as shown in FIG. 8. The phases of the transmission signals are controlled by the phase shifter 13 in the same manner as the prior art shown in FIG. 2. After amplified by the high power amplifier 15, the transmission signals are output from the miniature transmitter/receiver 2 and are emitted in the air by way of the element antennas (1-1a-1-1m).

Thus, the phased array radar can be constituted which aligns the phases of the respective transmission signals (transmission electric waves) and concentrates the power in the required direction, the transmission signals being emitted from the element antennas (1-1a-1-Nm) comprising a plurality of the blocked element antennas (1-1a-1-1m).

Figure 4C:
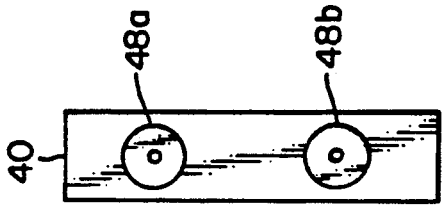
FIG. 4(a) is the front view of the integrated circuit and FIG. 4(b) and FIG. 4(c) are respectively the side elevations thereof.
Figure 4A:
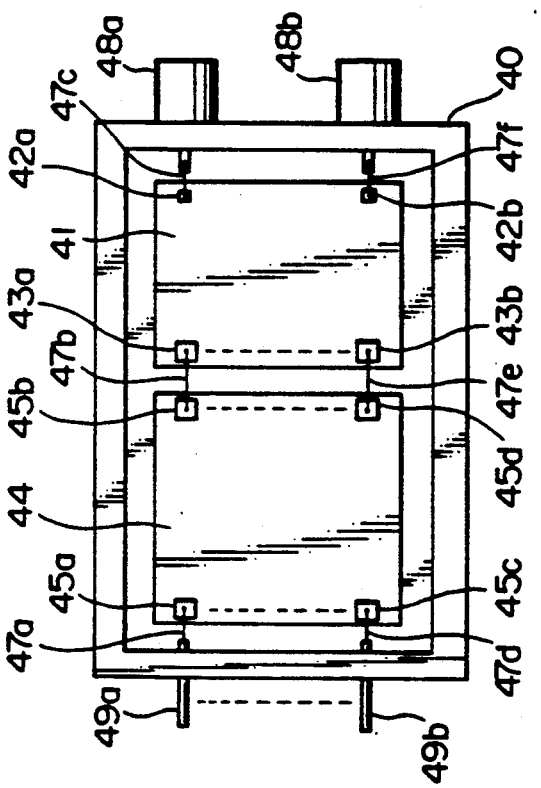
Figure 4B:
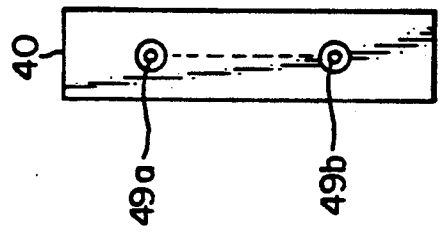
Figure 5A:
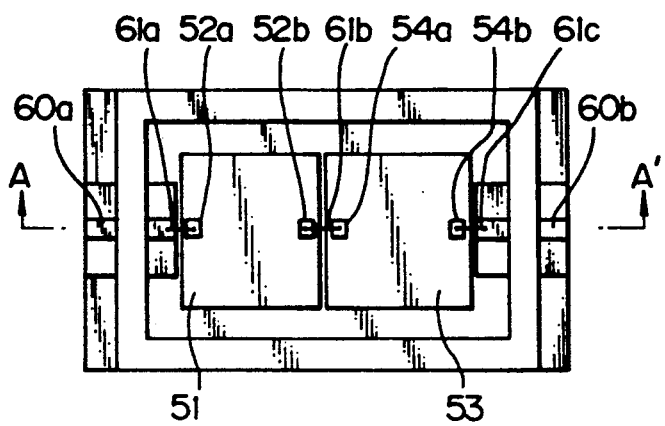
FIG. 5(a) is the front view of the integrated circuit and FIG. 5(b) is the side elevation thereof.
Figure 5B:
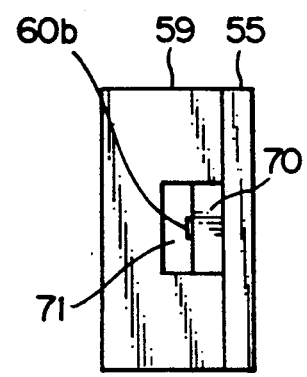
Figure 6:
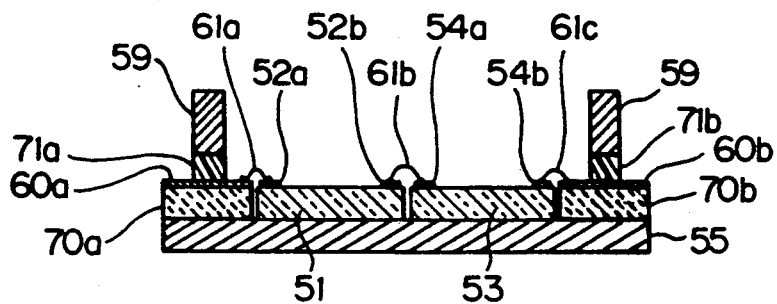
FIG. 6 is the sectional view taken along the line A—A' in FIG. 5(a)

On the other hand, the reception signals input to the element antennas are applied to the miniature transmitters/receivers (2-1a-2-Nm) connected to the respective element antennas (1-1a-1-Nm), and then are input to the transmission/reception switch 14b shown in FIG. 4. Then the reception signals are synchronized to the reception timing by means of the transmission/reception switch 14b and are input to the low noise amplifier 16, and after amplified by the low noise amplifier, are input to the phase shifter 13 via the transmission/reception switch 14a. After the phase of the reception signals are controlled by the phase shifter 13, they are input to the power supply circuits (70-1-70-N). These power supply circuits (70-1-70-N) are divided into blocks line by line according to the arrangement of the element antennas (1-1a-1-Nm) in the same manner as the transmission system. For example, with regard to the power supply circuit 70-1, the reception signals incident to the element antennas (1-1a-1-Na) are phase shifted in a requied direction by the phase shifter 13 incorporated in the miniature transmitters/receivers (2-1a-2-Na) in accordance with the direction of arrangement of the element antennas (1-1a-1-Na), whereby the unidirectional phased array radar for the reception signals can be constituted. The reception signals combined by the power supply circuit (70-1-70-N) are input to the reception signal converting units (4-1-4-N) corresponding to the respective blocks. Then in the same manner as the prior art, frequency conversion, band-pass filtering, A/D conversion and electro/optical conversion are succeedingly executed on the signals, which are input to the signal processing unit 11 as the optical digital signals. In the signal processing unit 11, the reception signals which pass orthogonally the unidirectional phased array radar are subjected to the unidirectional digital beam forming processing between the blocks or between the blocked element antennas (1-1a-1-Na) and the blocked element antennas (1-1m-1-Nm), so that the required reception waves can be obtained.

The second embodiment of the present invention will next be explained with reference to FIG. 9.

The signals input to the input terminal 12 as the time sharing signals comprising the transmission signals and the local oscillation signals from the external apparatus are applied to the respective reception signal converting units 4 by the distributor 5. And in the same manner as the embodiment shown in FIG. 7, the input signals are separated by the reception signal converting units 4 into the transmission signals and the local oscillation signals. The transmission signals are applied to the power supply circuits 70 and the local oscillation signals are applied to the frequency converters 7 respectively.

The transmission signals output from the reception signal converting units 4, for example 4-1, are input to the power supply circuit 70-1. The power supply circuit 70-1 is consisted of a plurality of blocks respectively adapted to supply the power signal in the vertical direction (or in the lateral direction) depending on the arrangement of the element antennas and to divide the transmission signals. The divided transmission signals are input to a plurality of the miniature transmitters/receivers (2-1a–2-1m) connected to the power supply circuit 70-1. In the miniature transmitters/receivers 2, the phases of the transmission signals are like in the embodiment shown in FIG. 8 controlled by the phase shifter 13. After amplified by the high power amplifier 15, the transmission signals are output from the miniature transmitters/receivers 2 and emitted in the air by way of the element antennas (1-1a–1-1m).

On the other hand, the reception signals incidental to the element antennas are applied to the transmission/reception switch 14b of the miniature transmitters/receivers (2-1a–2-Nm) connected to the respective element antennas (1-1a–1-Nm). The signals are then synchronized to the reception timing by the transmission/reception switch 14b and are input to the low noise amplifier 16. After amplified by the low noise amplifier, they are input to the phase shifter 13 by way of the transmission/reception switch 14a. The phases of the reception signals are controlled by the phase shifter 13 and are input to the power supply circuits (70-1–70-N). These power supply circuits (70-1–70-N) are divided into blocks line by line according to the arrangement of the element antennas (1-1a–1-Nm) in the same manner as the transmission system. For example with regard to the power supply circuit 70-1, the reception signals incidental to the element antennas (1-1a–1-Na) are phase shifted by the phase shifters 13 incorporated in the miniature transmitters/receivers (2-1a–2-Na) in accordance with the direction of arrangement of the element antennas in a required direction, so that the unidirectional phased array radar for the reception signals can be constituted. The reception signals combined by the power supply circuits (70-1–70-N) are input to the reception signal converting units (4-1–4-N) corresponding to the respective blocks, and the reception signals are input to the frequency converter 7 by the transmission/reception switching unit 6 while the local oscillation signals from the input terminals 12 are input to the frequency converter 7. In the frequency converter 7, the reception signals and the local oscillation signals are mixed together to be converted to intermediate frequency reception signals. The resulting reception signals are passed through the band-pass filter 8 which is adapted to remove unnecessary waves caused by the mixing, and are output to the signal processing unit 11 by way of the coaxial cable, twist pair cable, flexible printed substrate or the like and subjected to the digital beam forming process as explained above.

As explained above, the reception signal converting unit 4 according to the present invention is capable of dispensing with the A/D converter, the electro/optical converter (in particular the parallel/serial digital converting section) which consume much power, thereby attaining a compact and light construction of low power consumption.

Figure 10:
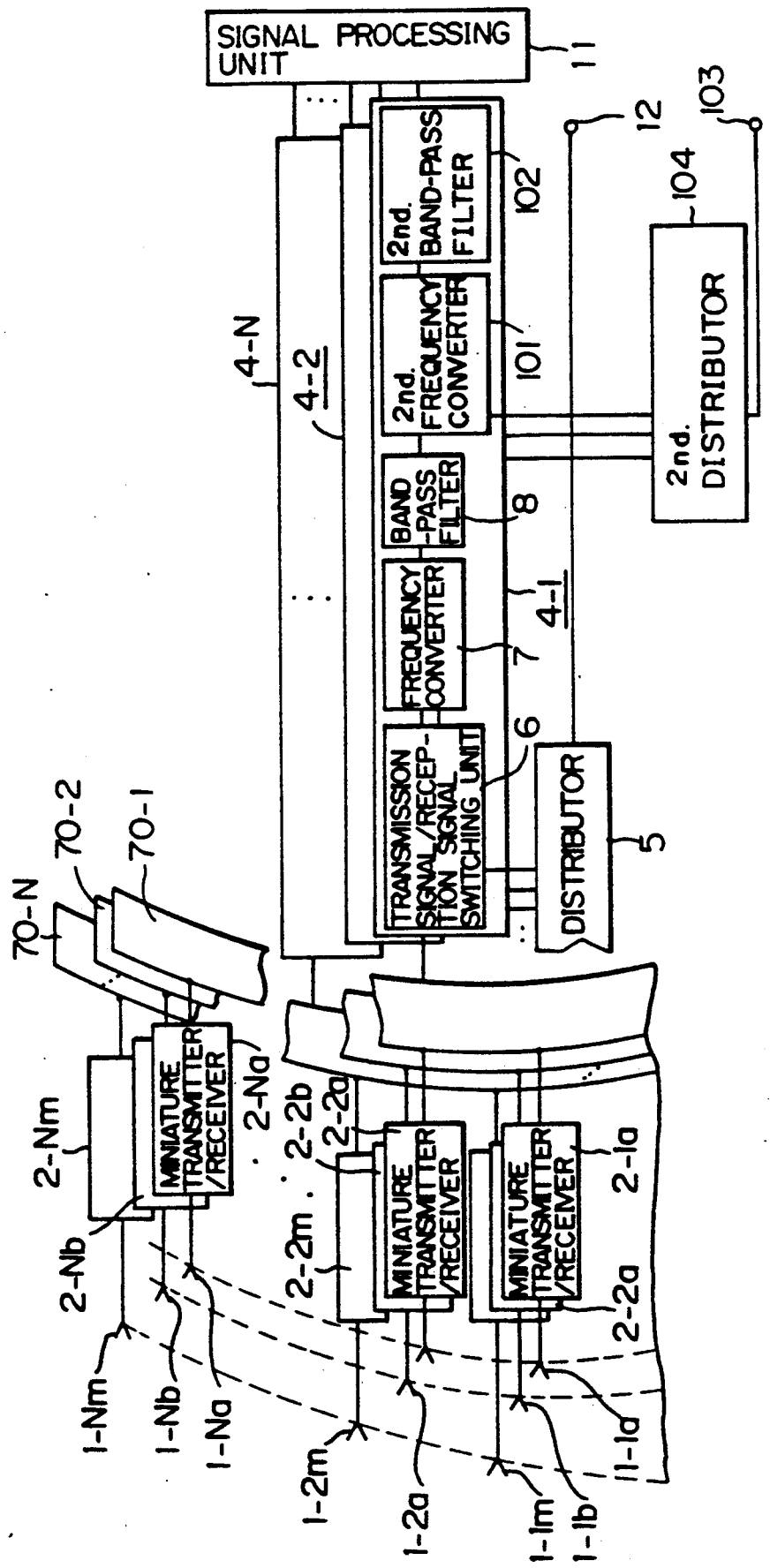
FIG. 10 is the block diagram illustrating a third embodiment of the antenna system according to the present invention.

FIG. 10 illustrates the third embodiment of the present invention. In FIG. 10, numeral 101 designates a second frequency converter, numeral 102 a second band-pass filter, numeral 103 a second local oscillation signal input terminal and numeral 104 a second distributor.

Figure 9:
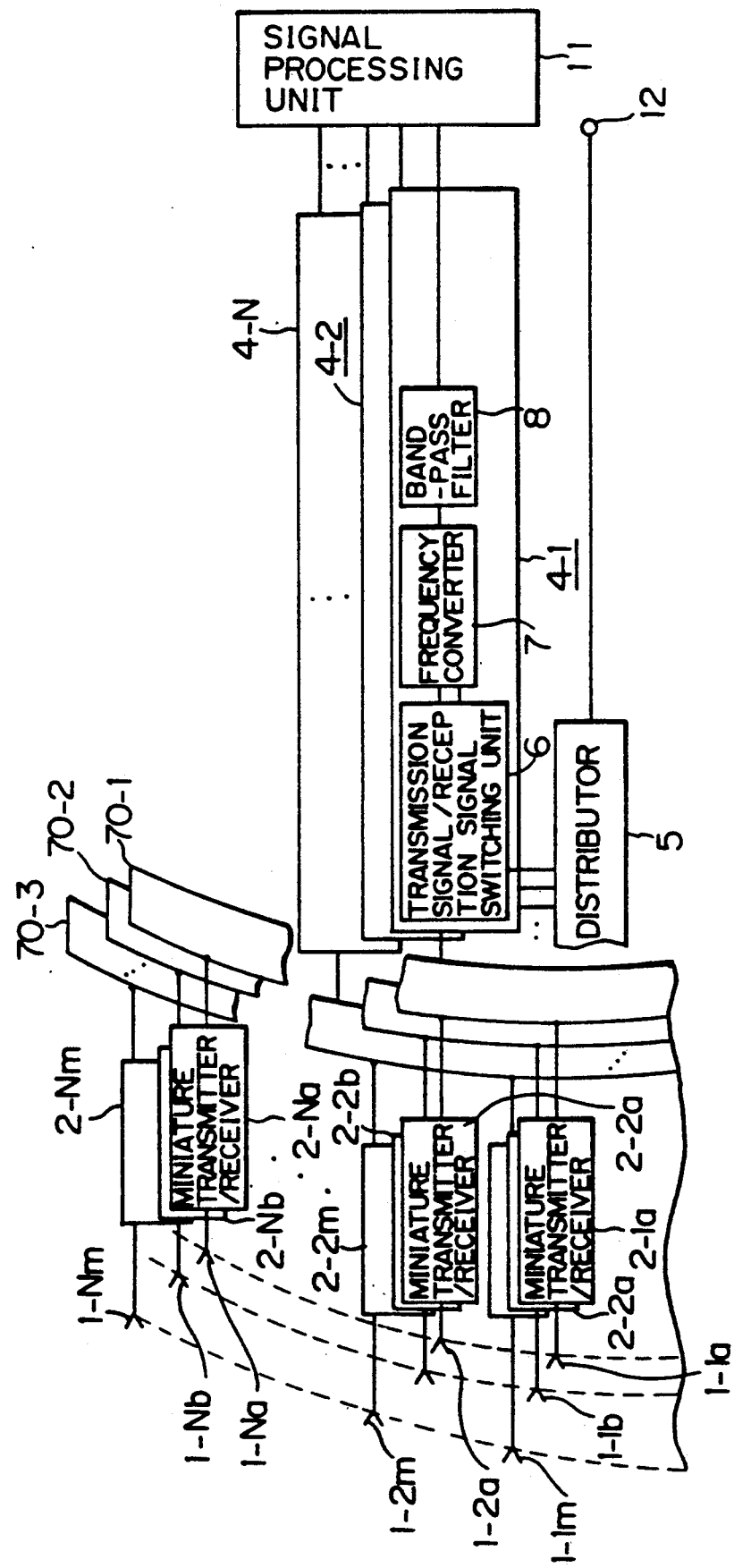
FIG. 9 is the block diagram illustrating a second embodiment of the antenna system according to the present invention.

In FIG. 10, the method of frequency conversion by the reception signal converting unit 4 is changed from the signal conversion method as shown in FIG. 9 to the double conversion method, wherein the intermediate frequency reception signals generated by the frequency converter 7 and the band-pass filter 8 are further mixed at the second frequency converter 101 with the second local oscillation signals input from the second local oscillation signal input terminal 103 and output by the second distributor 104 to the respective reception signal converting units 4 to be converted to the second intermediate frequency reception signals, which are in turn output to the signal processing unit by way of the second band-pass filter 102 adapted to remove the unnecessary waves generated by the second frequency converter 101. This system enables the band-pass range width of the second band-pass filter 102 to be narrower than the band-pass filter 8, so that the ratio of signal to noise power in the passage band-pass width can be improved, and the reception system having higher sensitivity can be constituted.

Figure 11:
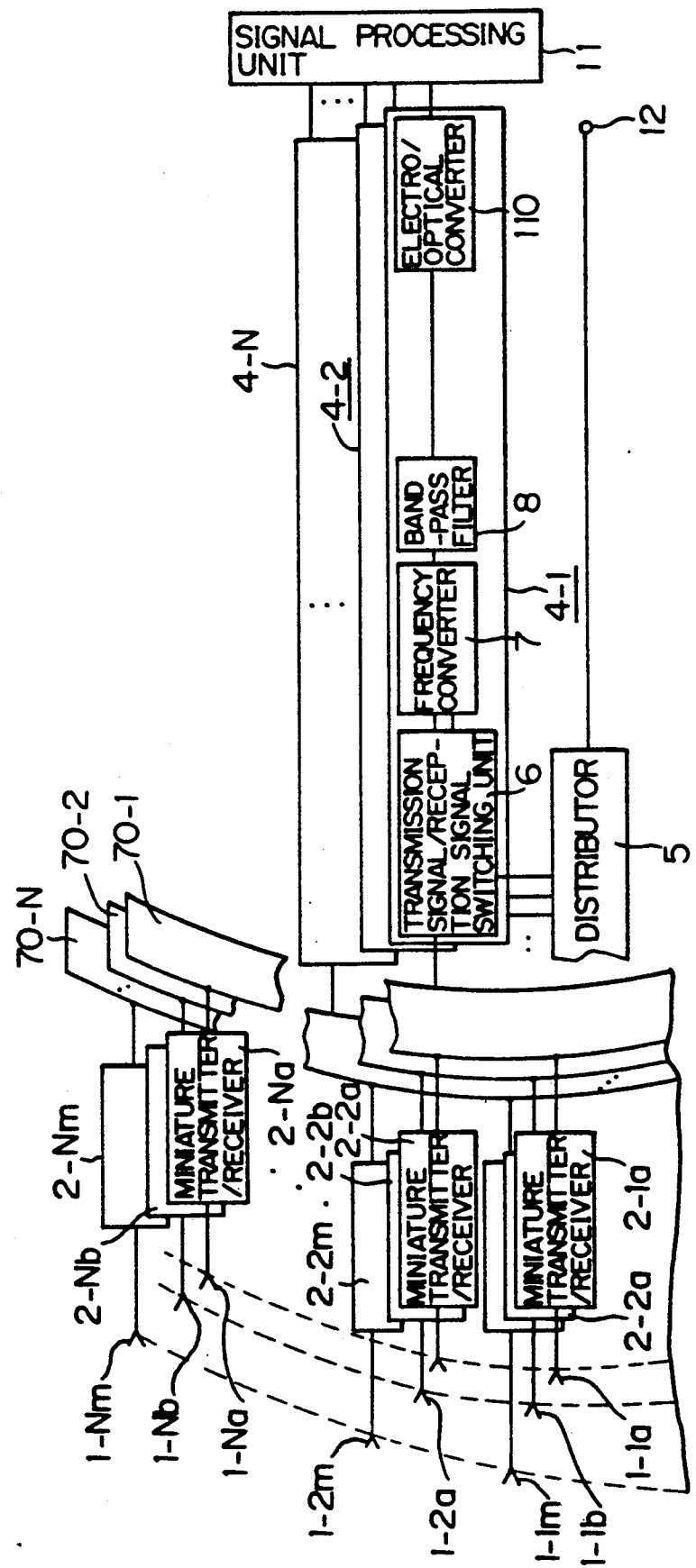
FIG. 11 is the block diagram illustrating a fourth embodiment of the antenna system according to the present invention.

FIG. 11 illustrates the fourth embodiment of the present invention wherein the numeral 110 designates an electro/optical converter adapted to directly effect the electro/optical conversion of the intermediate frequency reception signals.

Operation of the system shown in FIG. 11 is identical to that of the system shown in FIG. 9 except the reception signal converting units 4. After the unnecessary waves are removed from the intermediate frequency reception signals generated by the frequency converter 7 by the band-pass filter 8, the intermediate frequency reception signals are input to the electro/optical converter 110. The electro/optical converter 110 uses the analog signals which are the intermediate frequency reception signals as the modulation signals in the optical transmission system and transmits the optical signals in the analog form. Therefore since, in FIG. 7, the analog/digital converter 9 and the parallel/serial digital conversion section incorporated in the electro/optical converter 10 adapted to convert the parallel digital signal output by the converter 9 to optical digital signals can be dispensed with, consumption of power can be largely reduced and the system can be simplified.

Figure 12:
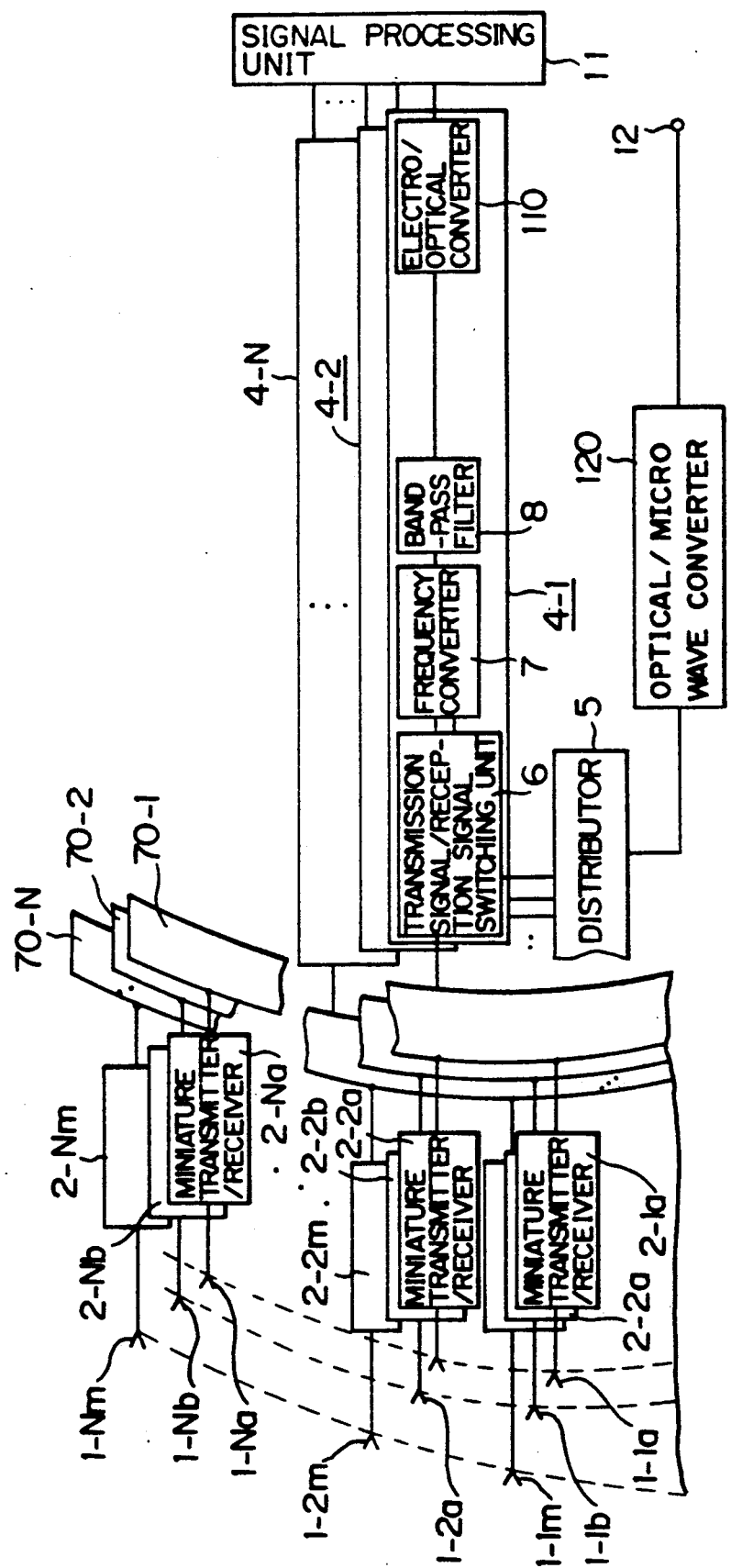
FIG. 12 is the block diagram illustrating a fifth embodiment of the antenna system according to the present invention.

FIG. 12 illustrates the fifth embodiment of the present invention and numeral 120 designates an optical/micro wave converter.

Operation of the system shown in FIG. 12 is identical to that of the system shown in FIG. 9 except the system for transmitting the input signals from the external apparatus. The signals input to the input terminal 12 as the time sharing optical analog signals comprised of the transmission signals and the local oscillation signals from the external apparatus are input to the optical/micro wave converter 120. In the optical/micro wave converter 120, the micro wave signals which are the modulated signals for optical transmission are demodulated and the transmission micro wave signals and the local oscillation signals are output in a time-sharing manner and then are applied to the distributor 5 which distributes and outputs the micro wave signals to the respective reception signal converting units 4.

According to the second embodiment through the fifth embodiment of the present invention, the wave guide or the coaxial track which is used between the external apparatus and the input terminal 12 in the first embodiment can be replaced by fine and light optical fibers.

It is to be understood that even if the distributor 5 is replaced by an optical distributor and the optical output signals from the distributor 5 are converted into the micro waves at the input ends of the respective reception signal converting units 4, the function of the present invention may not be impaired.

Figure 13:
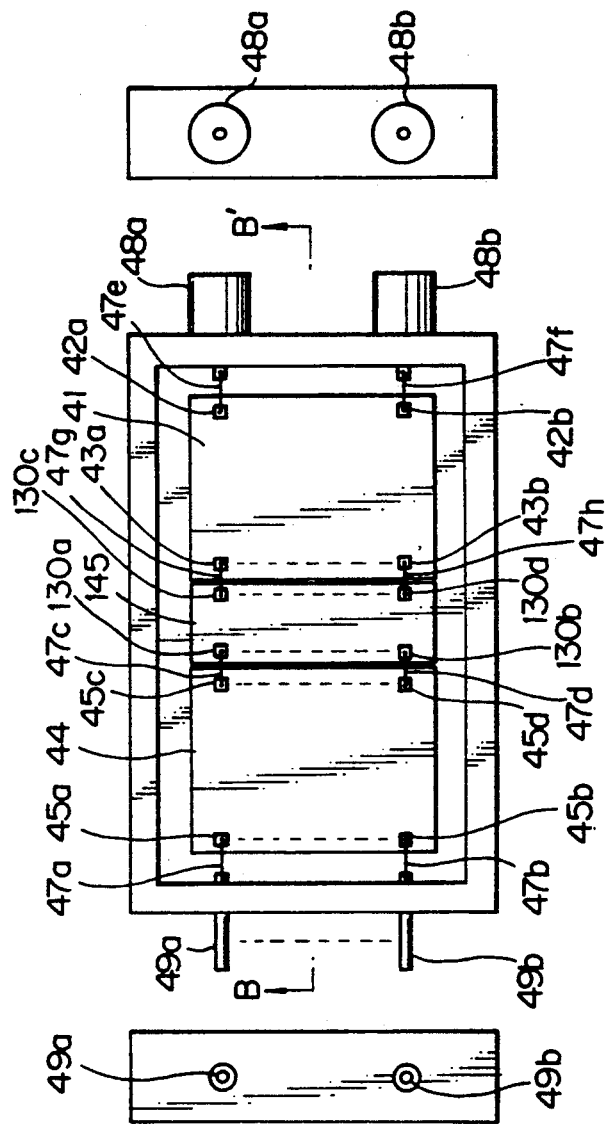
FIG. 13 illustrates a first embodiment of the integrated circuit in accordance with the mounting method according to the present invention.
Figure 14:
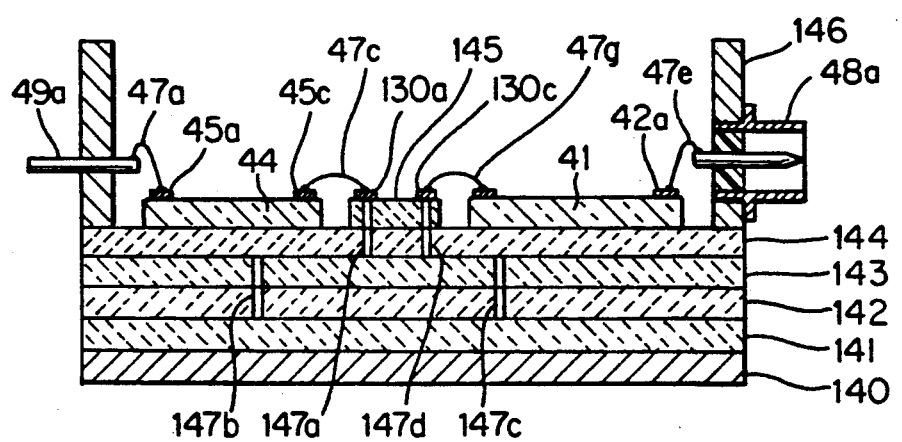
FIG. 14 is the sectional view taken along the line B—B' in FIG. 13(a)

FIG. 13(a) is the front view showing the first embodiment of mounting of the integrated circuit according to the present invention. FIG. 13(b) and FIG. 13(c) are the side elevations of FIG. 13(a) respectively. FIG. 14 is the sectional view taken along the line B—B' in FIG. 13(a).

In FIG. 14, numeral 140 designates a metallic conductor, numeral 141 a first dielectric member having one side surface joined to the metallic conductor 140 and the other side surface provided with the signal transmission surface, numeral 142 a second dielectric member having one side surface joined to the signal transmission surface of the first dielectric member and the other side surface having the surface for grounding, numeral 143 a third dielectric member having one side surface joined to the grounding surface of the second dielectric member and the other side surface provided with the signal transmission surface, numeral 144 a fourth dielectric member having one side surface joined to the signal transmission surface of the third dielectric member and the other side surface provided with the surface for grounding and numeral 145 a fifth dielectric member having one side surface joined to the grounding surface of the fourth dielectric member and the other side surface provided with the surface for signal transmission. It is to be noted that the dielectric members 141, 142, 143, 144 and 145 are provided therein with through holes 147 for supplying signals and power. Numeral 146 designates a seal ring, and numeral 130 input/output pads for connecting the through holes 147 provided on the fifth dielectric member 145, the micro wave integrated circuit 41 and the drive circuit 44.

Operation of the integrated circuit shown in FIG. 13 and FIG. 14 will next be explained. In FIG. 13, the high frequency signals input to the high frequency connector 48, for example 48a, are applied to the micro wave integrated circuit 41 by way of the gold wire 47e and the input/output pad 42a for the high frequency signals. To the drive circuit 44, there are input the external control signals input by the connector pin 49 by way of the gold wires 47a, 47b, and the input/output pads 45a, 45b. Predetermined drive signals responsive to the control signals are output by way of the gold wires 47c, 47d and the input/output pads 130a, 130b. The output signals are applied to the micro wave integrated circuit 41 by way of the through holes 147a–147d shown in FIG. 14, and the input/output pads 130c, 130d, gold wires 47g–47h and input/output pads 43a–43b shown in FIG. 13(a). The high frequency waves being transmitted in the micro wave integrated circuit 41 are set at a predetermined level and transmitted to an external device (not shown) by way of the input/output pads 42b for the high frequency signals, the gold wire 47f and the connector 48b for the high frequency signals.

In this way, wiring on the mounting surface can be reduced by constructing the accommodation casing as a multi-layer structure and the mounting density can be enhanced by reducing the longitudinal length of the integrated circuit.

Figure 15:
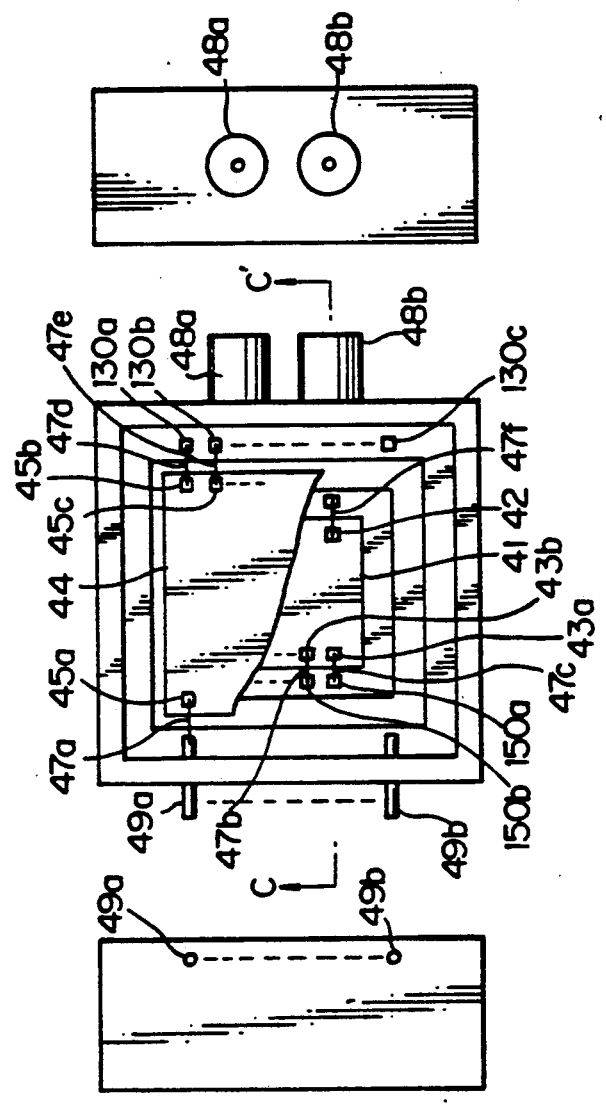
FIG. 15 illustrates a second embodiment of the integrated circuit in accordance with the mounting method according to the present invention.
Figure 16:
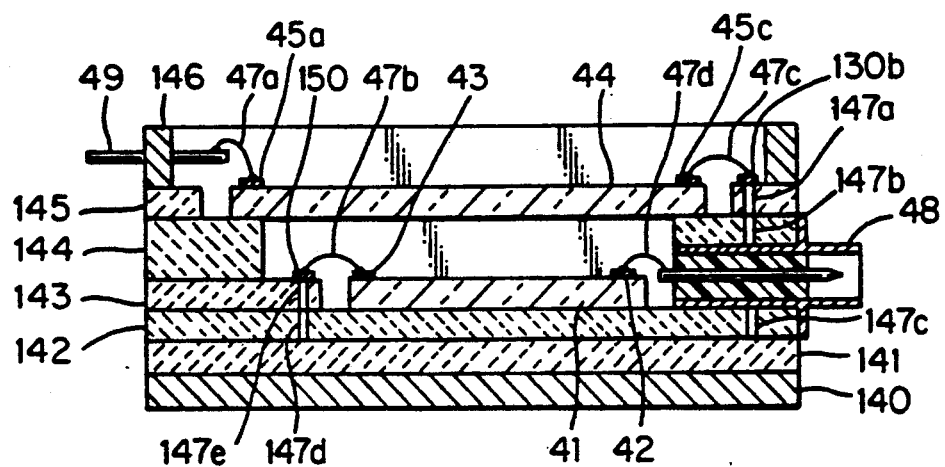
FIG. 16 is the sectional view taken along the line C—C' in FIG. 15(a)

FIG. 15(a) is the front view illustrating the second embodiment of the integrated circuit according to the present invention. FIG. 15(b) and FIG. 15(c) are the side elevations of FIG. 15(a). FIG. 16 is the sectional view taken along the line C—C' in FIG. 15(a).

In FIG. 16, numeral 140 designates a metallic conductor provided on the lower portion of the accommodation casing, numeral 141 a first dielectric member having one side surface joined to the metallic conductor 140 and the other side surface provided with the surface for signal transmission, numeral 142 a second dielectric member having one side surface joined to the signal transmission surface of the first dielectric member 141 and the other side surface provided with the surface for grounding, numeral 143 a third dielectric member having one side surface joined to the grounding surface of the second dielectric member 142 and the other side surface provided with the surface for signal transmission, numeral 144 a fourth dielectric member having one side surface joined to the signal transmission surface of the third dielectric member 143 and the other side surface provided with the surface for grounding and numeral 145 a fifth dielectric member having one side surface joined to the grounding surface of the fourth dielectric member 144 and the other side surface with the signal transmission surface as well as the grounding surface. It is to be noted that the dielectric members 141, 142, 143, 144 and 145 are provided therein with through holes 147 for supplying signals and power.

Numeral 146 designates a seal ring, numeral 150 an input/output pad for supplying the drive signals and the power to the micro wave integrated circuit 41, pad 150 being provided on the signal transmission surface of the third dielectric member 143, and numeral 130b input/output pads for the drive signals connecting the drive circuit 44 and the through holes 147a, 147b.

Operation of the integrated circuit shown in FIGS. 15 and 16 will next be explained. In FIG. 15, the high frequency signals input from the high frequency connector 48a are applied to the micro wave integrated circuit 41 by way of the gold wires 47 and the input/output pads 42 for the high frequency signals. The drive circuit 44 receives the external control signals input from the connector pins 49a, 49b through the gold wires 47 and the input/output pads 45 and outputs predetermined drive signals responsive to the control signals by way of the gold wires 47 and the input/output pads 130. The output signals are input from the input/output pad 43 for the drive signals to the micro wave integrated circuit 41 by way of the through holes 147a–147c, the signal transmission surface of the first dielectric member 141, the through holes 147d, 147e, as shown in FIG. 16, and the input/output pads 150 as shown in FIG. 15, so that the high frequency signals being transmitted in the micro wave integrated circuit 41 are set at a predetermined value and the set signals are transmitted to the external device by way of the input/output pad 42 for the high frequency signals, the gold wires 47 and the connector 48b for the high frequency signals.

In this way, the micro wave integrated circuit and the drive circuit associated with the micro wave integrated circuit are not disposed on a plane but accommodated in the accommodation casing of a multi-layer construction, and the wiring is so connected vertically in the through holes in the multi-layer ceramic member as the accommodation casing that the longitudinal dimension of the casing and the ineffective space over the micro wave integrated circuit are reduced, so that the mounting density can be enhanced.

Figure 18:
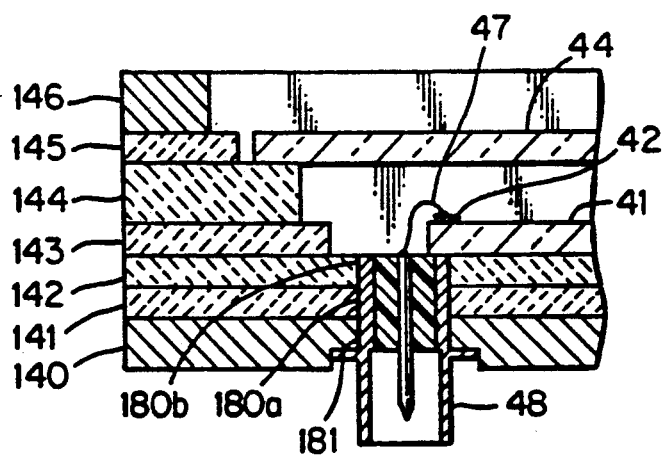
FIG. 18 is the sectional view taken along the line D—D' in FIG. 17(a)
Figure 17A:
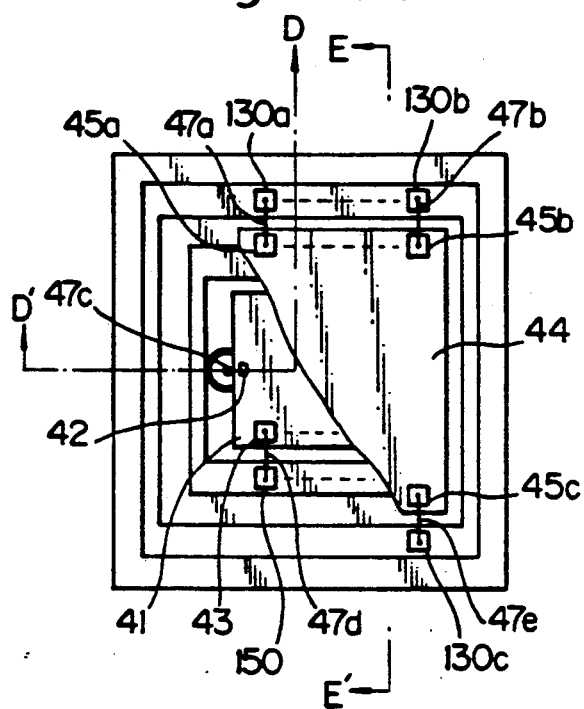
FIG. 17(a) is the front view of the integrated circuit and FIG. 17(b) and FIG. 17(c) are respectively the side elevations thereof.
Figure 17B:
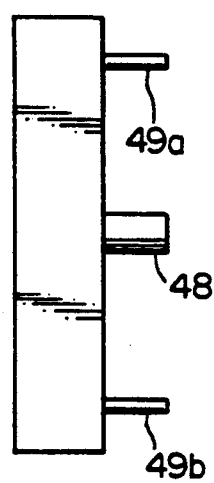
Figure 17C:
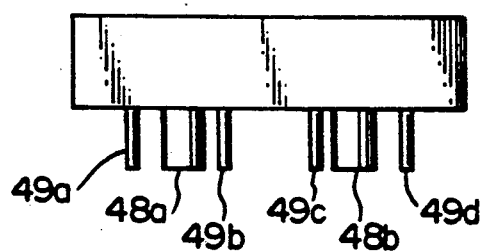
Figure 19:
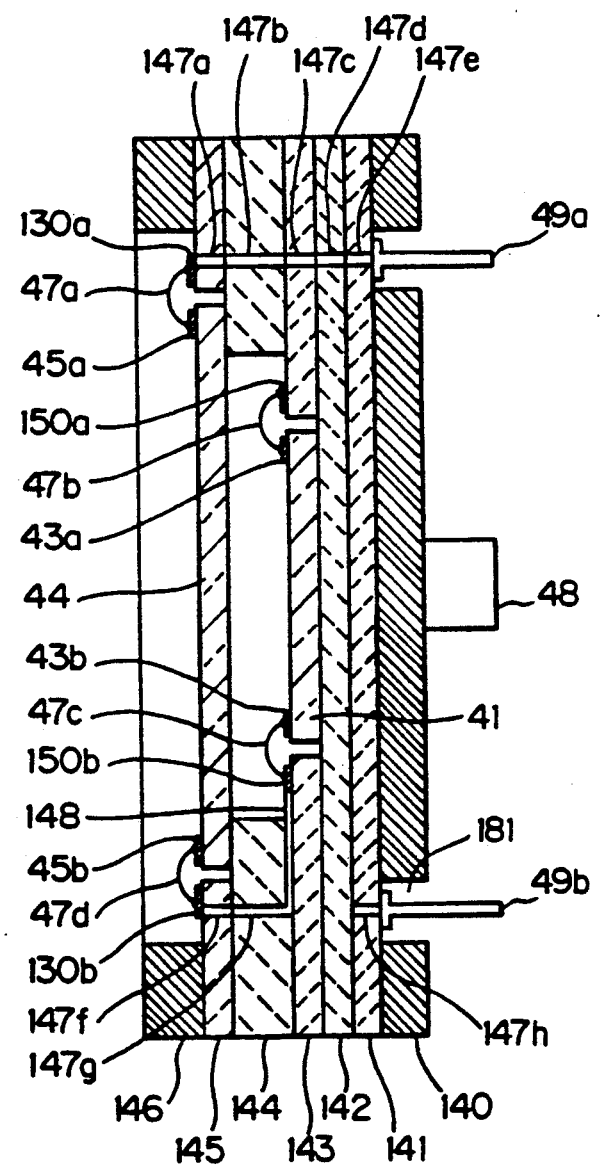
FIG. 19 is the sectional view taken along the line E—E' in FIG. 17(a)

FIG. 17(a) is the front view illustrating the third embodiment of the integrated circuit according to the present invention. FIG. 17(b) and FIG. 17(c) are the side elevations of FIG. 17(a) respectively. FIG. 18 is the sectional view taken along the line D—D' in FIG. 17(a) and FIG. 19 is the sectional view taken along the line E—E' in FIG. 17(a).

In FIG. 18, numeral 140 designates a metallic conductor provided at the lower portion of the accommodation casing and having a through hole 181 enabling the high frequency connector 48 and the connector pin to extend therethrough, numeral 141 a first dielectric member having one side surface joined to the metallic conductor 140 and the surface for connecting and fixedly mounting the connector pins 49a, 49b (shown in FIG. 19) and the other side surface provided with the surface for signal transmission, numeral 142 a second dielectric member having one side surface joined to the signal transmission surface of the first dielectric member 141 and the other side surface provided with the surface for grounding, numeral 143 a third dielectric member having one side surface joined to the grounding surface of the second dielectric member 142 and the other side surface provided with the surface for signal transmission, numeral 144 a fourth dielectric member having one side surface joined to the surface for signal transmission of the third dielectric member 143 and the other side surface provided with the grounding surface, and numeral 145 a fifth dielectric member having one side surface joined to the grounding surface of the fourth dielectric member 144 and the other side surface provided with the surface for grounding. It is to be noted that the dielectric members 141, 142, 143, 144 and 145 are provided with through holes 147a, 147b, 147c, 147d, 147e (shown in FIG. 19) for supplying signals and power and the dielectric members 141, 142 are provided with through holes 180a, 180b for extending the high frequency connector 48 therethrough. Numeral 146 designates a seal ring, numeral 150 input/output pads adapted to supplying the drive signals and the power to the micro wave integrated circuit 41, pads 150 being provided on the signal transmission surface of the third dielectric member 143, and numerals 130a, 130b (shown in FIG. 19) input/output pads for the drive signals for connecting the drive circuit 44 and the through holes 147.

Operation of the integrated circuit shown in FIGS. 17, 18, 19 will next be explained. In FIG. 17, the high frequency signals input from the high frequency connector 48a are applied to the micro wave integrated circuit 41 by way of the gold wire 47c and the input-/output pad 42 for the high frequency signals. As shown in FIG. 19, the drive circuit 44 receives the external control signals input from the connector pin 49a by way of the through holes 147e, 147d, 147c, 147b and 147a and the gold wire 47a, and outputs the predetermined drive signals responsive to the control signals to the input pad 43b for the drive signals of the micro wave integrated circuit 41 by way of the gold wire 47d, the through holes 147f, 147g, the signal transmission track 148, the output pad 150b and the gold wire 47c, so that the high frequency signals being transmitted in the micro wave integrated circuit 41 can be set at a predetermined value and be transmitted to the external drive by way of the input/output pad 42 for the high frequency signals, the gold wire 47 and the connector 48b for the high frequency signals.

In this way, the micro wave integrated circuit and the drive circuit associated with the micro wave integrated circuit are not disposed on the same plane but accommodated in the accommodation casing having a layer structure, the wiring is connected vertically in the through holes provided through a multi-layer ceramic member constituting the accommodation casing so that the longitudinal dimension of the integrated circuit can be reduced and the ineffective space over the micro wave integrated circuit is reduced, so that the mounting density can be enhanced. Furthermore, since the high frequency connector for supplying the high frequency signals to the micro wave integrated circuit and the connector pin for inputting the external control signals to the drive circuit in the micro wave integrated circuit are provided on the lower surface of the accommodation casing, the longitudinal dimension of the integrated circuit can be also reduced, so that the mounting density can be enhanced.

Figure 21:
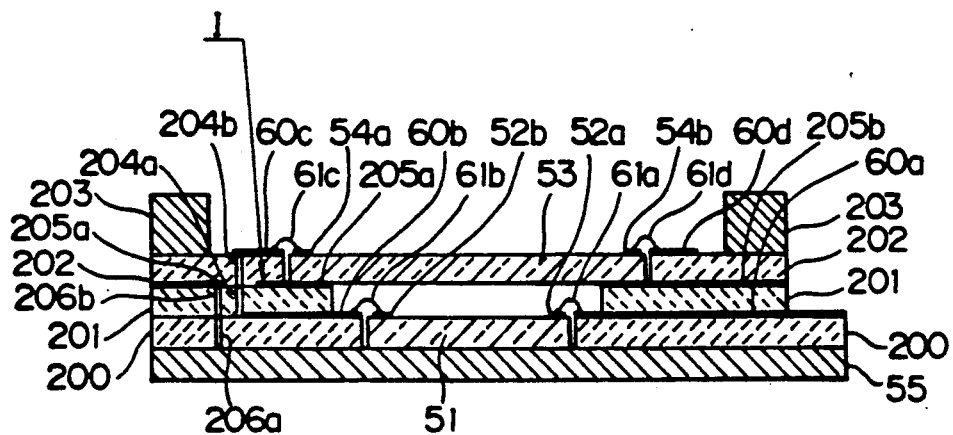
FIG. 21 is the sectional view taken along the line F—F' in FIG. 20(a)
Figure 22:
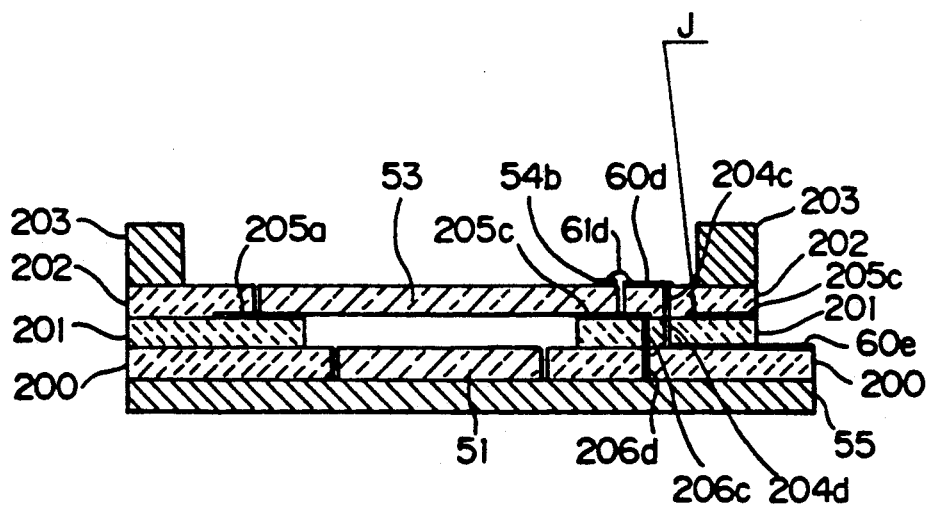
FIG. 22 is the sectional view taken along the line G—G' in FIG. 20(a)
Figure 23:
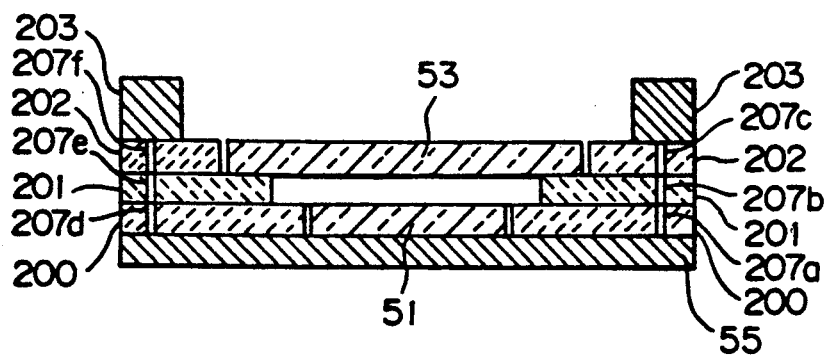
FIG. 23 is the sectional view taken along the line H—H' in FIG. 20(a)
Figure 26:
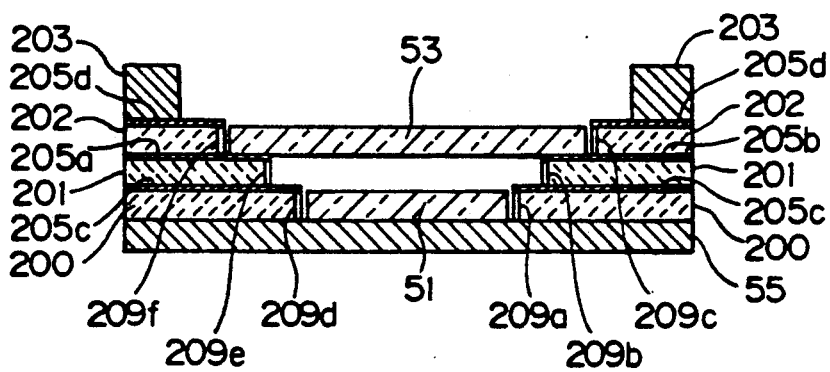
FIG. 26 illustrates the electromagnetic shield in which side through holes are formed inside the integrated circuit.
Figure 27:
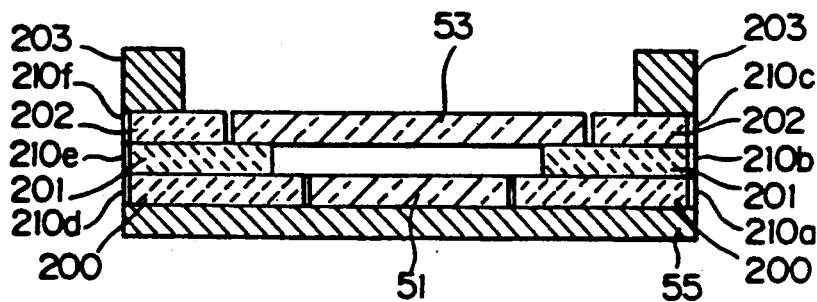
FIG. 27 illustrates the electromagnetic shield in which the side through holes are formed outside the integrated circuit.
Figure 24:
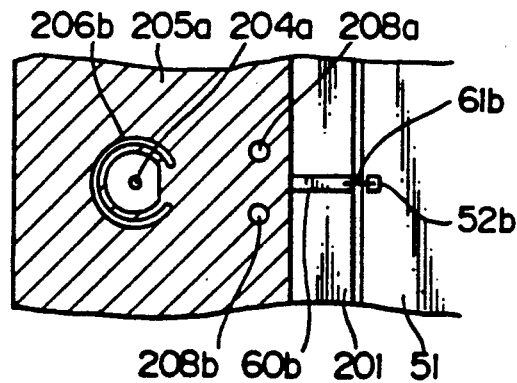
FIG. 24 is the view seen from the arrow I in FIG. 21.
Figure 25:
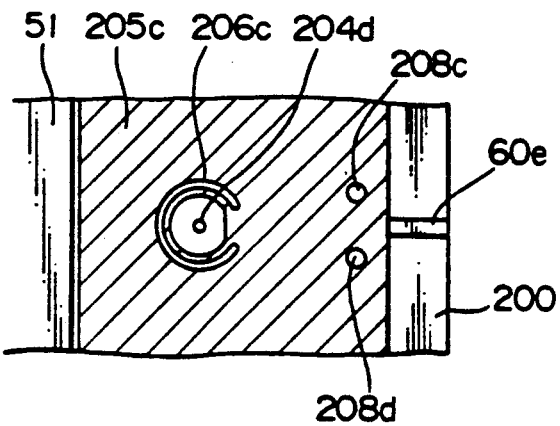
FIG. 25 is the view seen from the arrow J in FIG. 22.
Figure 28:
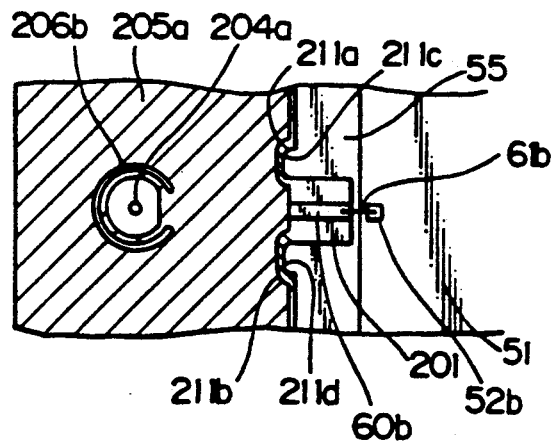
FIG. 28 illustrates the concrete example of transforming from the micro strip track to the triplate track.

FIG. 20(a) is the front view illustrating the fourth embodiment of the integrated circuit according to the present invention. FIG. 20(b) is the side elevation of FIG. 20(a). FIG. 21 is the sectional view taken along the line F—F' in FIG. 20(a). FIG. 22 is the sectional view taken along the line G—G' in FIG. 20(a). FIG. 23 is the sectional view taken along the line H—H' in FIG. 20(a). FIG. 24 is the view as seen from the arrow I in FIG. 21. FIG. 25 is the view as seen from the arrow J in FIG. 22. FIG. 26 illustrates the electromagnetic shield embodied in such a way as to have side through holes inside thereof. FIG. 27 illustrates the electromagnetic shield embodied in such a way as to have side through holes outside thereof. FIG. 28 illustrates a concrete example of transition from the micro strip track using side through holes to the triplate track.

Figure 20:
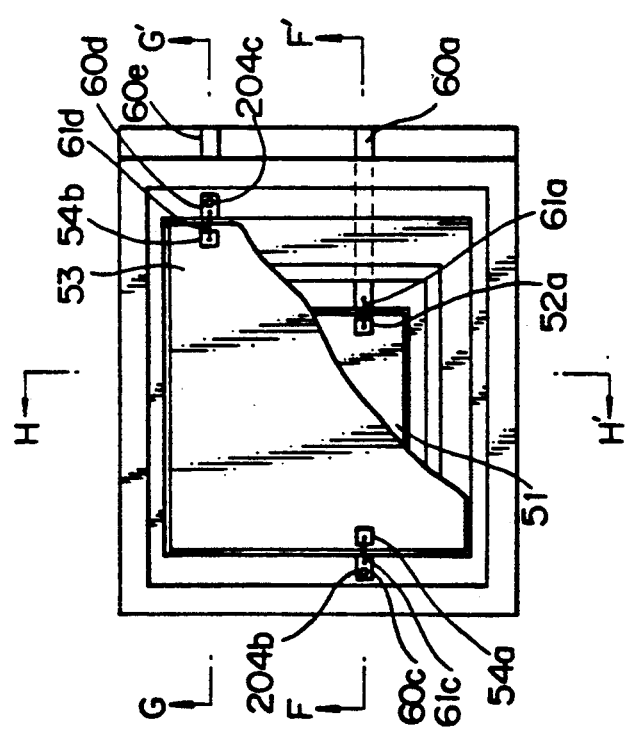
FIG. 20 illustrates a fourth embodiment of the integrated circuit in accordance with the mounting method according to the present invention.

In FIG. 20, numeral 200 designates a first dielectric member having one side surface joined to the metallic conductor 55 and the other side surface provided with the strip track 60, numeral 201 a second dielectric member having one side surface joined to the surface of the first dielectric member 200 forming the strip track and the other side surface provided with grounding patterns, numeral 202 a third dielectric member having one side surface joined to the grounding pattern surface of the second dielectric member 201 and the other side surface provided with the strip track 60, numeral 204 through holes for connecting the second dielectric member 201 and the strip track 60 provided on the third dielectric member 202, numeral 205 grounding patterns formed on the second dielectric member 201, numeral 206 through holes of a horse shoe configuration as an outer conductor which are adapted to form a coaxial track together with the through holes 204 provided in the first dielectric member 200 and the second dielectric member 201, numeral 207 through holes for the electromagnetic shield provided circumferentially in the first dielectric member 200, the second dielectric member 201 and the third dielectric member 202 and connected to the metallic conductor 55 and the metallic frame 203 for seal, numeral 208 through holes provided through the first dielectric member 200 and the second dielectric member 201, and connected to the metallic conductor 55 and the grounding pattern 205, thereby effecting transition between the micro strip track and the triplate track, numeral 209 inside through holes for the electromagnetic shield, which are provided in the first dielectric member 200, the second dielectric numeral 201 and the third dielectric member 202 and are connected to the metallic conductor 55 and the metallic frame 203 for seal, numeral 210 outside through holes for the electromagnetic shield, which are provided at the outside of the first dielectric member 200, the second dielectric member 201 and the third dielectric member 202 and are connected to the metallic conductor 55 and the metallic frame 203 for seal, and numeral 211 side through holes provided through the first dielectric member 200 and the second dielectric member 201 and connected to the metallic conductor 55 and the grounding pattern 205, thereby effecting transition between the micro strip track and the triplate track.

Operation of the integrated circuit shown in FIGS. 20, 21, 22, 23 and 24 will next be explained. The flow of the high frequency signals will first be explained by referring to FIGS. 20(a), 21 and 22. The high frequency signals input from the strip track 60a are applied to the first micro wave integrated circuit 51 through the gold wire 61a and the input/output pad 52a on the first micro wave integrated circuit 51 and are set at a predetermined level. After the set signals are output to the input/output pad 52b on the first micro wave integrated circuit, they are applied to the second micro wave integrated circuit 53 by way of the gold wire 61b, the strip track 60b, the through holes 204a, 204b, the strip track 60c, the gold wire 61c and the input/output pad 54a on the second micro wave integrated circuit and are set at another predetermined level. Then, the set signals are output to the external device by way of the input/output pad 54b on the second micro wave integrated circuit, the gold wire 61d, the strip track 60d, the through holes 204c, 204d and the strip track 60e.

Next, the transition in the horizontal-vertical-horizontal direction of the high frequency transmission path from the first micro wave integrated circuit 51 to the second micro wave integrated circuit will be explained with reference to FIGS. 21 and 24. In FIG. 21, the strip track 60b defines the micro strip track as the high frequency transmission track which is paired with the metallic conductor 55, and is used for connection to the input/output pad 52b on the first micro wave integrated circuit. In order to transform the high frequency transmission track of the micro strip in a vertical direction, the metallic conductor 55 and the grounding pattern 205a are connected by the through holes 208a, 208b for transforming the micro strip track to the triplate track, as shown in FIG. 24, so that they are paired with the strip track 60b to form the triplate track. Also the grounding pattern 205a is paired with the strip track 60c to form the micro strip track for connection to the input/output pad 54a on the second micro wave integrated circuit. Then, the strip tracks 60b and 60c are connected by using the through holes 204a, 204b. Furthermore by means of the through holes 206a and 206b in the form of a horse shoe, the metallic conductor 55 and the grounding pattern 205a are connected to form the coaxial track, so that the propagation direction of the high frequency signals can be changed to the vertical direction.

The transition in the horizontal-vertical-horizontal direction of the high frequency transmission track from the second micro wave integrated circuit 53 to the strip track 60e for outputting externally will next be explained by referring to FIGS. 22 and 25. In FIG. 22, the strip track 60d is paired with the grounding pattern 205c to form the micro strip track and is used for connection to the input/output pad 54b of the second micro wave integrated circuit. Next, the strip tracks 60d and 60e are connected by using the through holes 204c, 204d and further the grounding pattern 205c and the metallic conductor 55 are connected by means of the through holes 206c, 206d in the form of a horse shoe to form the coaxial track for the external conductor of the vertical transition portion. Then, the strip track 60e is paired with the grounding pattern 205c and the metallic conductor 55 to form the triplate track so as to propagate the signals in the horizontal direction. Furthermore, by connecting the metallic conductor 55 and the grounding pattern 205c by means of the through holes 208c, 208d for transforming the micro strip track to the triplate track, the strip track 60e is paired with the metallic conductor 55 to form the micro strip track which is used as the interface for the external device. Although the through holes 208 have been used for transforming the micro strip track to the triplate track, the side through holes 211 may be provided at the end surface of the substrate as shown in FIG. 28, so that the metallic conductor 55 may be connected to the grounding pattern 205a. In case that the through holes cannot be filled with metallic materials having a low resistance, the through holes may be formed as side through holes which are then processed by plating or the like to improve the electrical characteristics.

The electromagnetic shield will next be explained by referring to FIG. 23. As shown in FIG. 23, the through holes 207 for the electromagnetic shield are provided through the first dielectric member 200, the second dielectric member 201 and the third dielectric member 202 to connect the metallic conductor 55 and the metallic frame 203 for sealing. The electromagnetic shield may be attained by the distance between the through holes for the electromagnetic shield being sufficiently narrow and by sealing the metallic frame 203 by means of the metallic cover.

It is also to be noted that as shown in FIGS. 26 and 27, the outside or inside through holes 209, 210 may be provided on or in the integrated circuit to provide the electromagnetic shield, or if an electromagnetic shield having a fairly high frequency is required, the side through holes may be more effective because of its capability of providing an entire shield or nearly entire shield.

What is claimed is:
1. An integrated circuit comprising:
   micro wave integrated circuit means having first input/output pads for high frequency signals and second input/output pads for drive signals and power signals;
   drive circuit means having third input/output pads for said drive signals and said power signals and connected to said micro wave integrated circuit means through said second and third input/output pads so as to drive the micro wave integrated circuit means;
   high frequency connector means connected to said micro wave integrated circuit means through said first input/output pads so as to transmit said high frequency signals;

connecting means connected to said drive circuit means through said third input/output pads so as to apply said drive signals and said power signals to the drive circuit means; and casing means for keeping said micro wave integrated circuit means, said drive circuit means, said high frequency connector means and said connecting means therein, wherein said casing means further includes:

a metallic conductor;

a first dielectric member having one side surface joined to said metallic conductor and the other side surface for signal transmission;

a second dielectric member having one side surface joined to said first dielectric member other side surface for signal transmission and the other side surface for grounding;

a third dielectric member having one side surface joined to said second dielectric member other side surface for grounding and the other side surface for signal transmission;

a fourth dielectric member having one side surface joined to said third dielectric member other side surface for signal transmission and the other side surface for grounding;

a fifth dielectric member having one side surface joined to said fourth dielectric member other side surface for grounding and the other side surface for signal transmission;

through holes provided respectively through said second to fifth dielectric members for electrically connecting the side surfaces for signal transmission of said first to fifth dielectric members;

sealing means joined to said other side surface for signal transmission of said fifth dielectric member; and seal cover means joined to said sealing means, wherein said micro wave integrated circuit is connected to and disposed on said other side surface for grounding of said second dielectric member, and said drive circuit means is connected to and disposed on said other side surface for grounding of said fourth dielectric member, and wherein said micro wave integrated circuit means and said drive circuit means are electrically connected through said through holes and said side surfaces for signal transmission of said first, third and fifth dielectric members.

2. An integrated circuit according to claim 1 wherein at least one of said through holes is formed as a first through hole in a said dielectric member, and another of said through holes is formed as a second through hole shaped as an incomplete ring concentric with said first through hole and electrically connected to a first said surface for grounding and said metallic conductor, and wherein said first surface for grounding is electrically insulated from said first through hole, whereby a coaxial connection is provided.

3. An integrated circuit according to claim 2 wherein said second through hole is horse shoe shaped and is physically separated from said first through hole.

4. An integrated circuit according to claim 3 wherein said first surface for grounding is separated from said first through hole by an area substantially circularly shaped but truncated toward a gap of said horse shoe shape.

5. An integrated circuit according to claim 4 wherein said first through hole and said second through hole are filled with a conductive material.

6. An integrated circuit according to claim 4 wherein said first through hole and said second through hole are filled with a conductive material.

7. An integrated circuit comprising:

micro wave integrated circuit means having first input/output pads for high frequency signals and second input/output pads for drive signals and power signals;

drive circuit means having third input/output pads for said drive signals and said power signals and connected to said micro wave integrated circuit means through said second and third input/output pads so as to drive the micro wave integrated circuit means;

high frequency connector means connected to said micro wave integrated circuit means through said first input/output pads so as to transmit said high frequency signals;

connecting means connected to said drive circuit means through said third input/output pads so as to apply said drive signals and said power signals to the drive circuit means; and casing means for keeping said micro wave integrated circuit means, said drive circuit means, said high frequency connector means and said connecting means therein, wherein said casing means further includes:

a metallic conductor;

a first dielectric member having one side surface joined to said metallic conductor and the other side surface for signal transmission;

a second dielectric member having one side surface joined to said first dielectric member other side surface for signal transmission and the other side surface for grounding;

a third dielectric member having one side surface joined to said second dielectric member other side surface for grounding and the other side surface for signal transmission;

a fourth dielectric member having one side surface joined to said third dielectric member other side surface for signal transmission and the other side surface for grounding;

a fifth dielectric member having one side surface joined to said fourth dielectric member other side surface for grounding and the other side surface for signal transmission;

through holes provided respectively through said first to fifth dielectric members for electrically connecting the side surfaces for signal transmission of said first to fifth dielectric members;

said high frequency connector means extending through said metallic conductor and connected to said micro wave integrated circuit means through said through holes of said first and second dielectric members;

said connecting means extending through said metallic conductor in an electrically insulating manner and connected to said through hole of said first dielectric member;

sealing means joined to said other side surface for signal transmission of said fifth dielectric member; and seal cover means joined to said sealing means,
wherein said micro wave integrated circuit means is connected to and disposed on said other side surface for grounding of said second dielectric member; said drive circuit means is connected to and disposed on said other side surface for grounding of said fourth dielectric member; said micro wave integrated circuit means and said drive circuit means are electrically connected through said through holes of said third, fourth and fifth dielectric members and said side surfaces for signal transmission of said first, third and fifth dielectric members; said high frequency connector means and said micro wave integrated circuit means are electrically connected through said other side surface for grounding of said second dielectric member; and said connecting means and said drive circuit means are electrically connected through said through holes of said first to fifth dielectric members and said side surfaces for signal transmission of said first, third and fifth dielectric members.

8. An integrated circuit according to claim 7 wherein at least one of said through holes is formed as a first through hole in a said dielectric member, and another of said through holes is formed as a second through hole shaped as an incomplete ring concentric with said first through hole and electrically connected to a first said surface for grounding and said metallic conductor, and wherein said first surface for grounding is electrically insulated from said first through hole, whereby a coaxial connection is provided.

9. An integrated circuit according to claim 8 wherein said second through hole is horse shoe shaped and is physically separated from said first through hole.

10. An integrated circuit according to claim 9 wherein said first surface for grounding is separated from said first through hole by an area substantially circularly shaped but truncated toward a gap of said horse shoe shape.

11. An integrated circuit according to claim 10 wherein said first through hole and said second through hole are filled with a conductive material.

12. An integrated circuit according to claim 10 wherein said first through hole and said second through hole are filled with a conductive material.

13. An integrated circuit comprising a plurality of micro wave integrated circuit means, each having input/output pads for high frequency signals, and casing means for keeping said plurality of micro wave integrated circuit means therein, said integrated circuit further including:
first and second micro wave integrated circuit means out of said plurality of micro wave integrated circuit means;
a metallic conductor having said first micro wave integrated circuit means thereon;
a first dielectric member having one side surface joined to the side surface of said metallic conductor having said first micro wave integrated circuit means thereon, and having the other side surface having a first strip track thereon which is connected to said input/output pads of said first micro wave integrated circuit means;
a second dielectric member having one side surface joined to said other side surface of said first dielectric member, having the other side surface having a grounding pattern thereon, the grounding pattern having said second micro wave integrated circuit means thereon, and having signal transmission transforming means for high frequency signals therein which is joined to said strip track on said first dielectric member; and
a third dielectric member having one side surface joined to said other side surface of said second dielectric member, having the other side surface having a second strip track thereon which is connected to said input/output pads of said second micro wave integrated circuit means, and having through holes therein which is connected to said signal transmission transforming means of said second dielectric member.

14. An integrated circuit according to claim 13, wherein said first and second micro wave integrated circuit means and said first to third dielectric members are formed as one unit, and a plurality of the units are formed as a multi-layer structure.

15. An integrated circuit according to claim 13, wherein said strip track of said first dielectric member and said metallic conductor are used to provide a micro strip track, and a through hole for connecting said grounding pattern of said second dielectric member and said metallic conductor is provided in said first dielectric member to form a triplate track, so that the high frequency signal transmission is transformed from said micro strip track to said triplate track.

16. An integrated circuit according to claim 15, wherein said through hole for connecting said grounding pattern of said second dielectric member and said metallic conductor is formed as a side through hole.

17. An integrated circuit according to claim 15, wherein said through hole for connecting said grounding pattern of said second dielectric member and said metallic conductor is formed in the form of a horse shoe, thereby forming a coaxial track.

18. An integrated circuit according to claim 13, wherein said signal transmission transforming means includes a through hole provided in said second dielectric member for connecting said strip track of said first dielectric member and said through hole of said third dielectric member.

19. An integrated circuit according to claim 13, further including metallic frame sealing means joined to the upper most dielectric member, and through holes provided in said first to said upper most dielectric members for connecting said metallic conductor and said metallic frame means, thereby forming an electromagnetic shield.

20. An integrated circuit according to claim 13, further including metallic frame sealing means joined to the upper most dielectric member, and inside through holes provided on said first to said upper most dielectric members for connecting said metallic conductor and said metallic frame means, thereby forming and electromagnetic shield.

21. An integrated circuit according to claim 13, further including metallic frame sealing means joined to the upper most dielectric member, and outside through holes provided on said first to said upper most dielectric members for connecting said metallic conductor and said metallic frame means, thereby forming an electromagnetic shield.

* * * * *

UNITED STATES PATENT AND TRADEMARK OFFICE
CERTIFICATE OF CORRECTION

PATENT NO. : 5,136,271

DATED : August 4, 1992

INVENTOR(S) : Yasuhiko Nishioka, Hazime Kawano and Kazuyoshi Inami

It is certified that error appears in the above-identified patent and that said Letters Patent is hereby corrected as shown below:

On title page, item [30], insert Foreign Application Priority Data;

Jan. 9, 1989 [JP] 1-2504

Apr. 11, 1989 [JP] 1-91436

Apr. 11, 1989 [JP] 1-91437

Apr. 11, 1989 [JP] 1-91438 --

Signed and Sealed this

Seventh Day of December, 1993

*Attest:*

BRUCE LEHMAN

*Attesting Officer*  *Commissioner of Patents and Trademarks*